(12) United States Patent
Schwarz et al.

(10) Patent No.: US 12,027,817 B2
(45) Date of Patent: Jul. 2, 2024

(54) LASER COMPONENT COMPRISING A LASER CHIP

(71) Applicant: OSRAM OLED GmbH, Regensburg (DE)

(72) Inventors: Thomas Schwarz, Regensburg (DE); Jörg Sorg, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 634 days.

(21) Appl. No.: 17/263,811

(22) PCT Filed: Aug. 1, 2019

(86) PCT No.: PCT/EP2019/070809
§ 371 (c)(1),
(2) Date: Jan. 27, 2021

(87) PCT Pub. No.: WO2020/025764
PCT Pub. Date: Feb. 6, 2020

(65) Prior Publication Data
US 2021/0249838 A1 Aug. 12, 2021

(30) Foreign Application Priority Data
Aug. 2, 2018 (DE) .................... 10 2018 118 762.9

(51) Int. Cl.
*H01S 5/02326* (2021.01)
*H01S 5/00* (2006.01)
(Continued)

(52) U.S. Cl.
CPC ........ *H01S 5/02326* (2021.01); *H01S 5/0087* (2021.01); *H01S 5/0232* (2021.01);
(Continued)

(58) Field of Classification Search
CPC ................... H01S 5/02423; H01S 5/02326
See application file for complete search history.

(56) References Cited

U.S. PATENT DOCUMENTS

| | | | | |
|---|---|---|---|---|
| 6,647,035 B1 * | 11/2003 | Freitas | .................. | H01S 5/4025 372/36 |
| 2007/0217470 A1 * | 9/2007 | DeFranza | ........... | H01S 5/02469 372/50.12 |

(Continued)

FOREIGN PATENT DOCUMENTS

| DE | 2721250 A1 | 11/1977 |
|---|---|---|
| DE | 19757850 A1 | 7/1998 |

(Continued)

OTHER PUBLICATIONS

International Search Report and Written Opinion in corresponding International Application No. PCT/EP2019/070809 mailed on Nov. 14, 2019, 14 pages.

*Primary Examiner* — Tuan N Nguyen
(74) *Attorney, Agent, or Firm* — MH2 TECHNOLOGY LAW GROUP LLP

(57) ABSTRACT

The invention relates to a laser chip located between a first and a second electrically and thermally conductive component, wherein: a first lateral surface of the laser chip is connected in a planar manner to a first lateral surface of the first component; the second lateral surface of the laser chip is connected in a planar manner to a first lateral surface of the second component; the laser chip has a radiation side which is located between the components; the radiation side is arranged set back inwardly at a predefined distance from the first end faces of the components; and a radiation space, which extends from the radiation side of the laser chip to the first end faces of the components is formed between the first (Continued)

lateral surfaces of the two components and adjacent to the radiation side of the laser chip.

19 Claims, 15 Drawing Sheets

(51) Int. Cl.
    *H01S 5/0232*     (2021.01)
    *H01S 5/02335*     (2021.01)
    *H01S 5/0237*     (2021.01)
    *H01S 5/0238*     (2021.01)
    *H01S 5/024*     (2006.01)
    *H01S 5/028*     (2006.01)

(52) U.S. Cl.
    CPC ........ *H01S 5/02335* (2021.01); *H01S 5/0237* (2021.01); *H01S 5/0238* (2021.01); *H01S 5/02476* (2013.01); *H01S 5/028* (2013.01)

(56) References Cited

U.S. PATENT DOCUMENTS

| | | | |
|---|---|---|---|
| 2009/0185593 A1* | 7/2009 | Stephens, IV | H01S 5/0237 438/122 |
| 2010/0246628 A1* | 9/2010 | Hattori | H01S 5/02257 372/50.23 |
| 2011/0142087 A1* | 6/2011 | Schroeder | H01S 5/4025 372/36 |
| 2016/0268770 A1 | 9/2016 | Tazawa et al. | |

FOREIGN PATENT DOCUMENTS

| | | |
|---|---|---|
| DE | 10011892 A1 | 9/2001 |
| DE | 102009040834 A1 | 5/2011 |
| DE | 102012215684 A1 | 3/2014 |
| DE | 102014119390 A1 | 6/2016 |
| DE | 102016113470 A1 | 1/2018 |
| DE | 102016122810 A1 | 5/2018 |

* cited by examiner

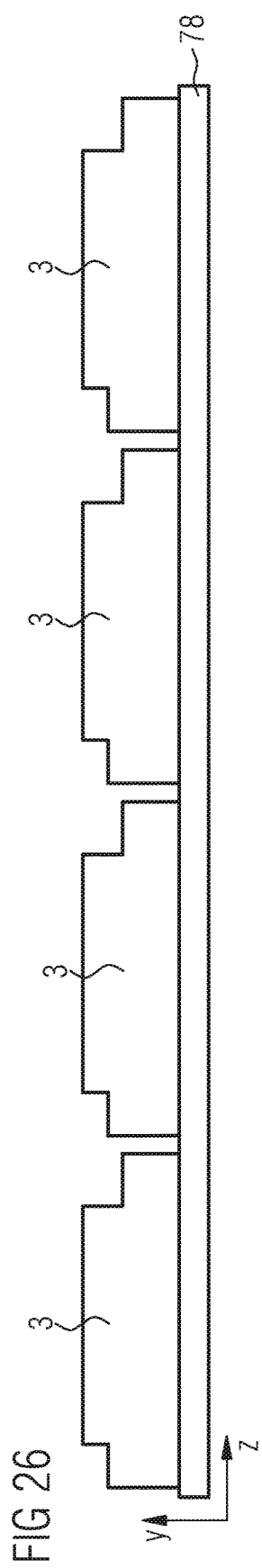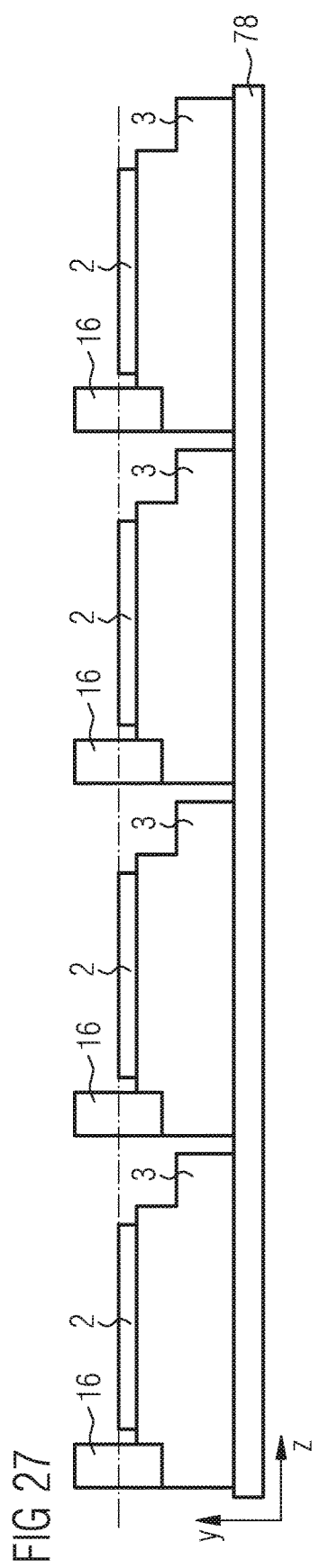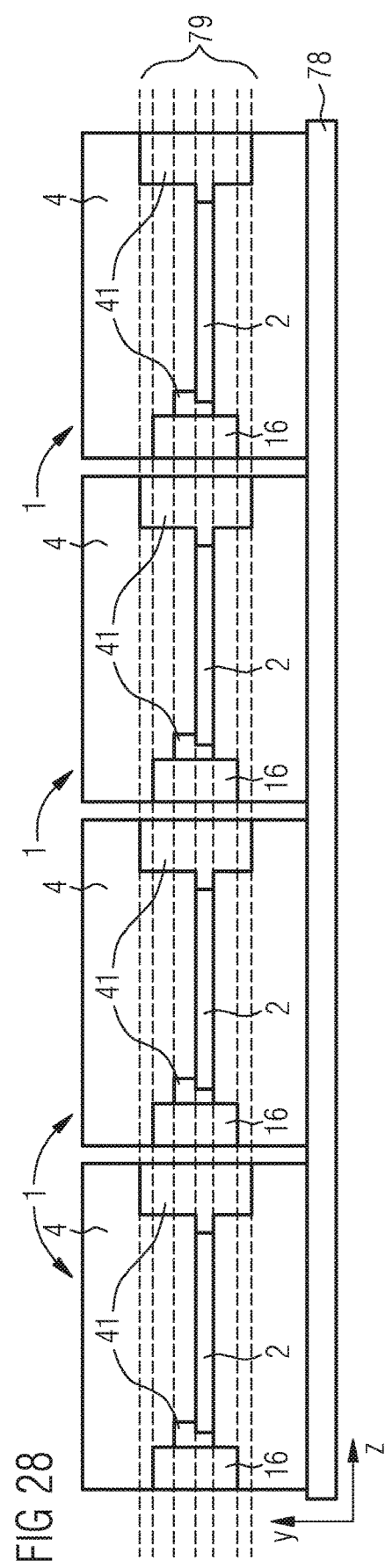

LASER COMPONENT COMPRISING A LASER CHIP

FIELD

The present invention relates to a laser component comprising a laser chip and to a method of manufacturing a laser component.

CROSS REFERENCE TO RELATED APPLCIATIONS

The present patent application is a national stage entry from International Application No. PCT/EP2019/070809, filed on Au-gust 1, 2019, published as International Publication No. WO 2020/025764 A1 on Feb. 6, 2020 and claims priority to German patent application 10 2018 118 762.9 dated Aug. 2, 2018, the disclosure content of which is hereby expressly incorporated by reference in its entirety.

BACKGROUND

DE 10 2013 216 526 A1 discloses a laser component comprising a laser chip, wherein the laser chip is arranged between two components and is thermally coupled with the two components.

It is an object of the present invention to provide an improved laser component.

The objects of the invention are solved by the independent claims.

In the dependent claims further embodiments of the laser component and the method of manufacturing the laser component are described.

SUMMARY

A laser component with a laser chip is proposed, wherein the laser chip is arranged between a first and a second component. The laser chip is thermally bonded to a first side face of the first component by one side face in an extensive manner. In addition, the laser chip is thermally bonded in an extensive manner to a first side face of the component by a second side face arranged opposite to the first side face. The laser chip has an emission side arranged between the first and the second side face of the component. The laser chip is embodied to emit electromagnetic radiation via the emission side. The emission side is arranged between the components. In addition, the emission side is set back inwardly at a predetermined distance from the first front faces of the components. Thus, the first front faces of the components protrude over the emission side of the laser chip in the direction of the laser chip.

An emission space is formed between the first side faces of the two components and adjacent to the emission side of the laser chip. The emission space extends from the emission side of the laser chip to the first front faces of the components.

The components are thermally and electrically conductive. For example, the components are made of a thermally and electrically conductive material or, in particular, are completely made of a thermally and electrically conductive material. For example, the components are made of metal or consist entirely of metal. For example, the components may be made of copper.

Thermal coupling between the side faces of the laser chip and the side faces of the components is e.g. achieved by direct contact between the side faces of the laser chip and the side faces of the components. Depending on the selected embodiment, a connecting layer, in particular an adhesive layer, a solder layer or a sintering layer may be formed between the side faces of the laser chip and the first side faces of the components. The connecting layer may improve the thermal coupling and/or the mechanical connection between the laser chip and the components. Due to the recessed arrangement of the emission side of the laser chip with regard to the front sides of the components, the emission side of the laser chip is protected against mechanical damage. The laser chip is e.g. embodied as a semiconductor chip comprising an active zone for generating electromagnetic radiation.

The laser component may have a conversion element in front of the emission side of the laser chip. The conversion element is thermally connected to the two components in an extensive manner. For this purpose, the conversion element may either be in direct contact with the components or connected to the components via a connecting layer. Due to the extensive thermal connection of the conversion element with the two components, a good cooling of the conversion element is achieved.

Depending on the selected embodiment, the conversion element may be arranged at least partially, in particular completely, in the emission space. With the help of the conversion element a wavelength of the electromagnetic radiation of the laser chip is converted to a desired wavelength. Thus, depending on the type of conversion element used, the laser component may emit electromagnetic radiation with different wavelengths. Due to the at least partial arrangement of the conversion element in the emission space, a compact design of the laser component is achieved. In addition, thermal coupling with the two components is improved by the arrangement of the conversion element in the emission space, since the conversion element is thermally connected to the components by a relatively large surface. In addition, the conversion element may be formed precisely in the mold and directly flat against the components by filling the emission space with a liquid or pasty conversion material. However, the conversion element may also be provided as a prefabricated conversion element and connected to the components with the help of a connecting layer.

In another embodiment, the conversion element is completely outside of the emission space and thermally coupled to the front faces of the two components. This embodiment allows for a simple design of the laser component, wherein, for example, conversion elements in the form of pre-produced plates are attached to the first front faces of the components, in particular by gluing. Furthermore, the emission space may be made smaller in this embodiment, since no space is required for providing the conversion element. Depending on the selected embodiment, the first front faces of the components are planarized in one method step prior to attaching the conversion element in order to achieve a large and flat contact surface and thus a good thermal coupling for the conversion element.

Depending on the selected embodiment, one of the two components may be embodied larger, e.g. with a volume that is at least 10% larger, in particular with a width that is at least 10% wider and/or a height that is at least 10% higher than the other component. In addition, the larger component is located on the side face of the laser chip which is closer to the active zone of the laser chip. Heat is generated in the active zone of the laser chip when the electromagnetic radiation is generated. The heat should be dissipated as quickly and as well as possible to avoid excessive heating of the active zone of the laser chip. By arranging the larger component as closely as possible to the active zone of the laser chip, the greater heat capacity of the larger component is utilized to dissipate the heat as quickly and efficiently as possible from the active zone of the laser chip. The first and second components are heat sinks that improve the heat dissipation from the laser chip. The components enable better cooling of the laser chip by simple means.

Depending on the selected embodiment, one or both components may have a recess on the first side face which extends to the first front face of the component. The recess provides an increased emission space independent from the distance between the components. Thus, scattering of electromagnetic radiation at the components may be reduced.

In addition, the laser chip may be arranged between the components in such a way that one side face of the laser chip, in the vicinity of which the active zone of the laser chip is arranged, protrudes into the emission space adjacent to the recess of the first side face of the component. Thus, an en-larged emission space adjacent to the side face of the laser chip is achieved that for the active zone of the laser chip. This avoids a direct emission of the electromagnetic radiation of the laser chip to the first side face. Thus, scattering losses of the electromagnetic radiation of the laser component are reduced. In addition, the first side faces of both components may have recesses that limit the emission space. This provides a larger overall emission space. Furthermore, the emission space may be embodied in such a way that the active zone of the laser component is arranged in a center of the emission space. Thus, the emission space may compensate for the asymmetric arrangement of the active zone closer to a side face of the laser component. Thus, the height of the emission space may be optimally adapted to the emission of the laser component without obstructing the emission of the electromagnetic radiation of the laser component.

Depending on the selected embodiment, the first side faces of the components are formed as flat surfaces at least in a partial surface of the laser chip. This provides a good thermal contact between the components and the laser component.

In another embodiment, an intermediate space is formed between the first side faces of the components and on the side of the laser chip. The intermediate space is at least partially and in particular completely filled with an electrically insulating material. The electrically insulating material lies against the two side faces of the components. For example, a dielectric may be used as an electrically insulating material. The mechanical connection between the two components may be improved by at least partially filling the space between the components outside of the emission space. In addition, the electrical insulation between the two components, which are e.g. completely made of an electrically conductive material, may be improved. In this way, electrical flashovers between the first side faces of the components are reduced, and in particular avoided. For example, plastic, silicone or epoxy resin may be arranged as electrically insulating material in the intermediate space between the first side faces of the components and outside of the emission space. The electrically insulating material may increase the mechanical stability of the laser component by an adhesive connection with the first side faces of the components and with further side faces of the laser chip.

In another embodiment, the emission space is at least partially filled with a material that is transparent to the electromagnetic radiation of the laser chip. In this way, the emission side of the laser chip may particularly be protected against environmental influences. For example, silicone may be used as a transparent material. Depending on the selected embodiment, both the emitting space and the remaining intermediate space may be at least partially, in particular completely filled with a transparent material, in particular silicone. Thus, a simple manufacturing process and a simple structure of the laser component are achieved.

In a further embodiment, the intermediate space between the components and outside of the emission space is at least partially, in particular completely filled with a material having a greater hardness and/or better adhesive properties than the transparent material of the emission space. In addition, the further material may also be non-transparent for the electromagnetic radiation of the laser chip. Outside of the emission space, it is not necessary to use a material that is transparent to the electromagnetic radiation of the laser chip, but materials may be used that provide greater mechanical stability and better adhesion. In addition, insulating materials may be used outside of the emission space, which are easier to process and/or more cost-effective.

In a further embodiment, the mechanical stability of the laser component may be improved by arranging another component between the laser chip and one of the two components. The further component has a thermal expansion coefficient which differs less from the thermal expansion coefficient of the laser chip than the thermal expansion coefficient of the component connected to the further component. In addition, the further component is made of a thermally and electrically conductive material which, for example, may have a higher thermal conductivity than metal, in particular a higher thermal conductivity than copper. The further component may e.g. be made of aluminum nitride, aluminum oxide, a copper-tungsten alloy, a copper-diamond alloy or silicon carbide. The additional component reduces mechanical stress that is e.g. generated when the laser chip is connected to the additional component and when the laser chip is connected to the component. Connecting may e.g. be achieved by means of a soldering process. The high temperatures of the soldering process which lead to mechanical stress between the component and the laser chip are reduced by the further component. This improves the quality of the mechanical connection and increases long-term stability.

It may be suitable to arrange the further component on the first side of the laser chip, which is closer to the active area of the laser chip. This reduces the thermal stress generated on the active zone when mounting the laser chip on the further component.

The components may be formed from lead-frame sections. For example, the lead-frame sections may be produced with a stamping process and/or with an etching process. By means of these methods, the shapes of the lead-frame sections may be manufactured quickly and with sufficient precision.

The first side faces of the components may have recesses, wherein the recesses form a part of the emission space. Depending on the selected embodiment, the recesses may be inserted into the first side faces of the components by punching, embossing and/or etching processes. By means of the recesses of the side faces of the components, the size of the emission space may be increased. Furthermore, the shape of the emission space may be determined by the shapes of the recesses. For example, the recesses of the side faces may have a partially spherical shape, a partially cylindrical shape, a partially truncated cone shape or a partial pyramid shape. In addition, the recesses may have a contour of a partial el-lipse in cross-section.

These shapes allow the cross-section of the emission space to be embodied in a suitable manner. For example, a cross-section of the emission space considered perpendicular with regard to the radiation direction may increase in the direction of the front sides. Thus, e.g. a region of an emission angle of the emitted electromagnetic radiation of the laser chip may be simulated by the emission space so that as little electromagnetic radiation as possible is scattered at the first side faces of the components. In addition, the partially spherical shape, the partial elliptical shape, the partially cylindrical shape, the partial cone shape or the partial pyramid shape may be used to increase a thermal contact surface between the conversion element, which is at least partially arranged in the emission space, and the components. Thus, heat may efficiently be transferred from the conversion element to the components.

In another embodiment, the components comprise second front faces. The second front faces may be arranged opposite to the first front faces or laterally to the first frontfaces. The laser component may be mounted on a carrier with side faces of the components, in particular with second faces of the components. The side faces of the components may be mounted directly on electrical lines of the carrier.

The carrier may e.g. have the form of a circuit board, for example. The second front faces are electrically connected to electrical conductors of the circuit board. In this way, a laser component is provided which is robustly and securely connected to a carrier, wherein the electrical contacting of the laser component is carried out via the components. Thus, large currents may be conducted to the laser chip via the second front faces.

In an embodiment, the carrier has an electrical conduction layer, wherein an electrical insulation layer is applied to a part of the electrical conduction layer. On top of this insulation layer, a further electrical conduction layer is applied. The first component of the laser component is attached to the conductive layer and the second component to the further conductive layer. The electrical conduction layer may e.g. be in the form of a metal core of a printed circuit board. The electrical conduction layer and the further electrical conduction layer may differ in thickness and/or area. In particular, the electrical conduction layer is at least 10%, and in particular at least 50% thicker than the further electrical conduction layer. For example, the electrical conduction layer may be a substantial carrier layer of the carrier. Thus, a good thermal dissipation of the heat from the laser component to the conductive layers of the carrier is achieved. For example, the carrier may be embodied as a circuit board with a metal core, wherein the electrical and thermal conduction layer is realized by the metal core.

Depending on the selected embodiment, several laser components may be electrically arranged in series and/or in parallel on the carrier and connected by means of the carrier's conductive layers, with the electrical connections of the components being connected to the conductive layer and the further conductive layer.

In an embodiment, the first side faces of the two components of a laser component have a larger distance in the area of the second front faces of the components than in the area of the laser chip. Thus, the distance between the second front faces is increased. This is particularly advantageous if the laser component is mounted on a carrier by the second front faces and the laser component is electrically contacted by the second front faces. Due to the increased distance, the mounting of the laser component on the carrier is easier. The danger of electrical short circuits between the two components is reduced.

In a further embodiment, the two components of the laser component outside of the emission space are at least partially covered with an electrically insulating covering material, wherein the covering material at least partially covers edges and/or ridges of the surfaces of the two components. In this way, the risk of electrical flashovers caused by voltage peaks at ridges or edges of the components is reduced. Furthermore, the roughness of the surfaces of the components is reduced. Thus, the laser component may be processed more eas-ily and safely.

Depending on the selected embodiment, a protective diode may be arranged in the space between the two components and next to the laser chip, the protective diode electroconductively connecting the two components in the reverse direction of the laser diode and thus protecting the laser chip against an overvoltage in the reverse direction.

A method for manufacturing a laser component is proposed, wherein a laser chip is arranged between a first component and a second component. The components are made of a thermally and electrically conductive material. The laser chip is thermally coupled to a first side face of a first component by a first side face. The laser chip is coupled to a first side face of a second component by a second side face. For example, the laser chip is mounted onto the first side face of the component with the first side face directly or indi-rectly via a thermally and electrically conductive connection layer. In addition, the second side face of the laser chip is connected to the first side face of the second component either directly or via a thermally and electrically conductive connecting layer.

At a front side, the laser chip has an emission side. The emission side is embodied to emit electromagnetic radiation. The laser chip is arranged between the components in such a way that the emission side of the laser chip is located between the components. The emission side of the laser chip is arranged inwardly at a predetermined distance from the first front sides of the components. Between the first side faces of the two components and adjacent to the emission side of the laser chip, an emission space is formed. The emission space extends from the emission side of the laser chip to the first front faces of the components. This provides a simple method for manufacturing a laser component.

In an embodiment of the method, a conversion element is arranged in front of the emission side of the laser chip, wherein the conversion element is thermally coupled to the two components directly or via a connecting layer. The conversion element may be arranged either at least partially in the emission space or completely in the emission space or completely outside the emission space. The thermal coupling of the conversion element with the components leads to an improved cooling of the conversion element. When the conversion element is arranged in the emission space, the distances between the areas where the heat is generated in the conversion element and the components are shorter. Thus, the heat dissipation from the conversion element may be faster.

The conversion element may e.g. be filled into the blasting chamber in liquid or paste form. In addition, the conversion element may be inserted into the emission space as a prefabricated component and mechanically and thermally bonded to the components via a connecting layer, for example an adhesive layer or a soldering layer or a sintered layer.

The arrangement of the conversion element outside of the emission space has the advantage that prefabricated conversion elements, especially plate-shaped conversion elements, may be used. The connection between the conversion element and the components may e.g. be established by means of a thermally conductive adhesive layer, a thermally conductive solder layer or a thermally conductive sintered layer. The arrangement of the conversion element in the emission space has the advantage that the installation space is reduced. In addition, the conversion element is thermally coupled to the components over a large area.

In an embodiment, the space next to the laser chip, which is formed between the components, is filled with an electrically insulating material, in particular with a pasty or liquid electrically insulating material. After hardening of the electrically insulating material, the intermediate space is at least partially filled and the components are mechanically connected to each other. In this way, the mechanical stability of the laser component may be increased, since the cured insulating material mechanically connects the two components and the laser chip. Furthermore, an electrical insulation between the two components may be improved by the insulating material. In particular, an electrical short circuit between the two components may be avoided by providing the electrically insulating material. For example, plastic, silicone, epoxy resin, etc. may be used as electrically insulating material.

In a further embodiment, recesses are introduced into the first side faces of the two components using an etching process before the components are assembled. Then the two components are mounted in such a way that the recesses of the first side faces of the two components form at least a part of the emission space. By means of the etching process, the recesses may be inserted into the two components precisely and quickly. For example, the components may be embodied in the form of lead-frame sections which are at least partially structured using etching processes.

In a further embodiment, the components are at least partially covered with electrically insulating covering material. Here, edges and/or ridges of the surfaces of the two components are at least partially covered. Thus, the roughness of the surface of the components is reduced. Thus, stress peaks at ridges and/or edges of the surfaces of the two components may be reduced or avoided.

In a further embodiment, a composite with several lead-frame sections is at least partially structured by means of an etching process, wherein recesses are made in the first side faces of the lead-frame sections. Afterwards the lead-frame sections of the composite are separated. The lead-frame sections are used as components for the production of the laser component.

Depending on the selected embodiment, the laser components may be manufactured individually or in a composite. In this context, a first composite with a plurality of first lead-frame sections may be provided. A laser chip is positioned on the first lead-frame sections of the first composite. A second composite with second lead-frame sections is also provided. The second composite is positioned on the first composite in such a way that a second lead-frame section of the second composite is positioned on a laser chip of a first lead-frame section of the first composite. Afterwards, the first and second lead-frame sections and the laser chips are mechanically connected by means of an electrically insulating material. In addition, depending on the selected embodiment, the arrangement may be separated into individual laser components having at least one pair of a first and a second lead-frame section and a laser chip.

In a further embodiment, the first component and/or the second component are manufactured by means of layer deposition processes, in particular with a 3D printing process or with a laser sintering process or with a galvanic deposition process. For example, the first component is manufactured using the layer deposition process. The laser chip is then positioned on the first component. An intermediate layer is then applied to the side of the laser chip on the first component. Finally, the second component, which is e.g. also produced using a layer deposition process, is applied to the first component, the laser chip and the intermediate layer.

Depending on the selected embodiment, the conversion element may be mounted on the first component or deposited on the first component before the second component is applied.

The laser chip can, for example, be embodied as a single laser chip or as a laser chip with several emission areas. The laser chip may be in the form of an edge-emitting laser chip. The laser chip may be in the form of a laser bar having several emission areas.

BRIEF DESCRIPTION OF THE DRAWINGS

The above-described properties, features and advantages of the present invention as well as the manner in which these are achieved will become clearer and more comprehensible in connection with the following description of the embodiment examples, which are explained in more detail in connection with the drawings and in which:

FIGS. 26 to 28 show method steps for manufacturing the laser component by means of an additive process for manufacturing the first and/or the second component.

DETAILED DESCRIPTION

Figure 1:
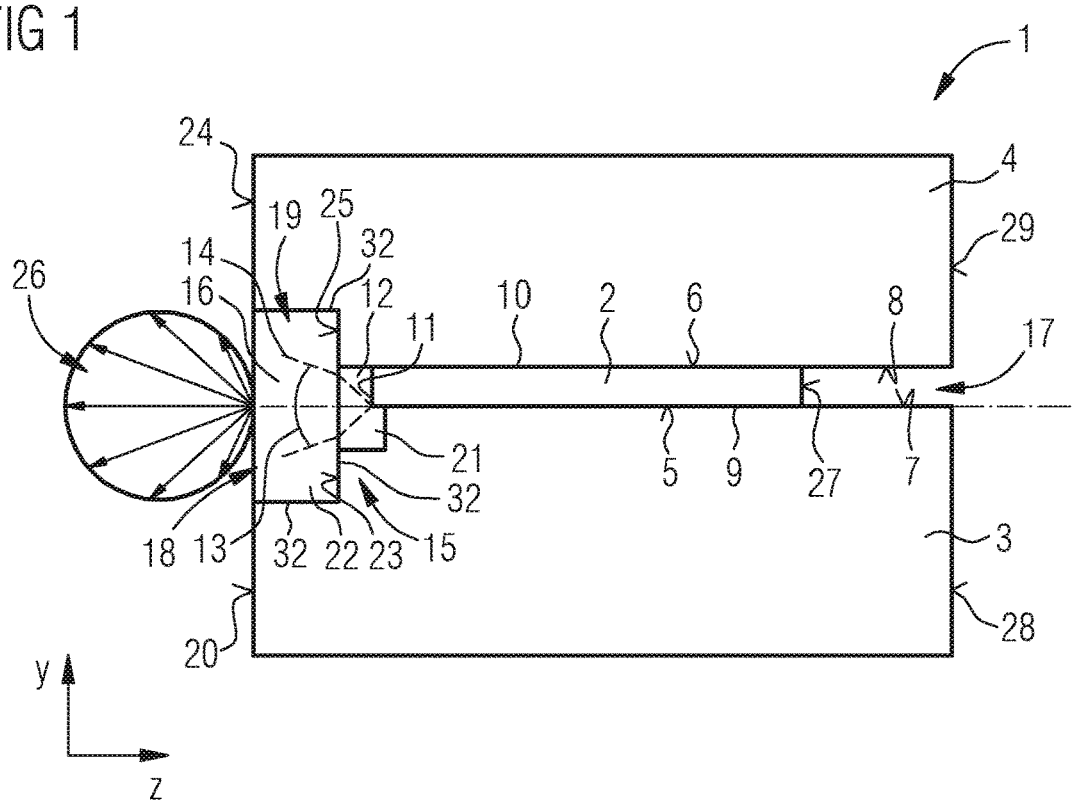
FIG. 1 shows a schematic cross-section through a longitudinal axis of a laser component.

FIG. 1 shows in a schematic cross-section along a longitudinal axis a laser component 1 with a laser chip 2, which is arranged between a first component 3 and a second component 4. The laser chip 2 has a first side face 5 and an opposite second side face 6. The first side face 5 of the laser chip 2 is connected to a first side face 7 of the first component 3 via a first connecting layer 9. The second side face 6 of the laser chip 2 is connected to a first side face 8 of the second component 4 via a second connecting layer 10. The connecting layers 9, 10 are thermally and electrically conduc-tive and e.g. cover the entire side face 5, 6 of the laser chip 2. For example, the connecting layers 9, 10 may be an adhesive layer, a solder layer or a sintering layer. The connecting layers 9, 10 are made of an electrically conductive material. Depending on the selected embodiment, the first and/or second connecting layer 9, 10 may be dispensed with. In these embodiments, the first side face 5 of the laser chip 2 may rest directly on the first side face 7 of the first component 3 and/or the second side face 6 of the laser chip 2 may rest directly on the first side face 8 of the second component 4.

The first and second components 3, 4 are made of a thermally and electrically conductive material. For example, components 3, 4 are each made in one piece and of a thermally and electrically conductive material. For example, components 3, 4 are made of a metal, particularly copper.

The laser chip 2 has an emission side 11, through which electromagnetic radiation is emitted along the longitudinal axis when the laser chip 2 is energized. The emission side 11 is arranged transversely, in particular perpendicular with regard to the longitudinal axis of the laser chip 2. The components 3, 4 serve as electrical contacts for the laser chip 2. The laser chip 2 is e.g. embodied in the form of a semiconductor chip which has a p-n structure consisting of a se-quence of semiconducting layers, wherein an active zone 12 is embodied between the two p-n structures which generates the electromagnetic radiation. The semiconductor layers of the laser chip 2 are essentially aligned in parallel to the first and second side faces 5, 6 of laser chip 2. Thus, the p-conductive layer is electrically connected to one component and the n-conductive layer to the other component. For example, the second component 4 may be a cathode and the first component 3 an anode of laser component 1.

In the shown embodiment example, the active zone 12 is arranged closer to the first side face 5 of the laser chip 2. On the emission side 11 a schematic diagram shows an emitting-angle region 13 for an electromagnetic radiation 14 emitted by the laser chip 2. In the emission direction in front of the emission side 11 of the laser chip 2, an emission space 15 is formed between the two components 3, 4. In the shown embodiment example, a conversion element 16 is provided in the emission space 15. The conversion element 16 is arranged in the emission space 15 at a distance from the emission side 11 of the laser chip 2.

The emission space 15 is formed by an intermediate space 17 and two recesses 18, 19 of the first component 3 and the second component 4. The intermediate space 17 results from a flat embodiment of the first side face 7 of the first component 3 and of the first side face 8 of the second component 4 and by arranging the laser chip 2 between the two first side faces 7, 8 of the components 3, 4. The first recess 18 of the first component 3 is inserted into the first side face 7 of the first component 3 and extends along the longitudinal axis from a first front face 20 of the first component 3 to below the first side face 5 of the laser chip 2. The first recess 18 has at least a width perpendicular to the longitudinal axis which corresponds at least to a width of the laser chip 2. The width of the recess 18 is center-symmetrical to the width of laser chip 2. The laser chip 2 protrudes into the emission space 15 with the first side face 5. The first recess 18 of the first component 3 is stepped in the depicted cross-section in a depicted y-z-plane along the longitudinal axis, with a smaller step 21 adjoining the laser chip 2 in the direction of the y-axis. The smaller step 21 may have ap-proximately the same depth in the y-direction as the laser chip 2 is high along the y-axis. The small step 21 merges into a large step 22 in the direction of the first face 20 of the first component 3. The large step 22 extends deeper into the first component 3 along the y-axis than the small step 21. Depending on the selected embodiment, the first recess 18 may also have other shapes.

The stepped embodiment of the first recess 18 provides a first contact surface 23. The first contact surface 23 is essentially parallel to the y-axis. With the second recess 19, the second component 4 has a single-stepped recess that extends from a first front face 24 of the second component 4 at a predetermined distance along the z-axis (longitudinal direction) towards the emission side 11 of the laser chip 2, but the second recess 19 ends at a distance from the emission side 11. The extension of the second recess 19 along the z-axis is as large as the extension of the large step 22 of the first recess 18. The second recess 19 has a second contact surface 25. The second contact surface 25 is arranged in parallel to the first contact surface 23. The second recess 19 has the same width as the first recess 18 perpendicular to the shown y-z-plane and is arranged with its width center-symmetrically with regard to the laser chip 2. The second recess 19 may have the same depth along the y-axis as the first recess 18 in the area of the large step 21. Thus, the active zone 12 of the laser chip 2 is arranged at the center of the emission space 15 with respect to the y-axis and in the center of the laser component 1. Instead of the stepped formation of the first and second recess 18, 19 of the first and second component 3, 4, other shapes may also be provided for the formation of the first and second recess 18, 19. For example, the recesses 18, 19 may have cross-sections in the shown y-z-plane, which increase in cross-section in the direction of the first front faces 20, 24 of the components 3, 4.

The conversion element 16 is arranged in the emission space and is flush with the first front sides 20, 24 of the components 3, 4 on an outer side. In addition, the conversion element 16 contacts the contact surfaces 23, 25 of the components 3, 4 on an inner side. Depending on the selected embod-invent, the conversion element 16 may also protrude over the first front faces 20, 24 of the components 3, 4. For example, the conversion element 16 is embodied as a plate-shaped conversion element. The conversion element may comprise phospho-rus as a conversion material. The conversion material is embodied to convert the wavelength of the electromagnetic radiation of laser chip 2 to another wavelength. The conversion element 16 is embodied to convert at least part of the electromagnetic radiation of laser chip 2 to another wavelength and to emit it. The converted electromagnetic radiation 26 is schematically depicted in the form of arrows.

The conversion element 16 may be provided as a prefabricated conversion element 16 and then inserted into the emission space 15. For example, the conversion element 16 may be connected to the components 3, 4 via a further connecting layer 32. The further connecting layer 32 is made of a thermally conductive material and improves the thermal conduction between the conversion element 16 and the components 3, 4. In addition, the further connecting layer 32 may form an adhesive or bonded connection between the conversion element 16 and the components 3, 4. The further connecting layer 32 should be as thin as possible in order to form a good thermal contact between the conversion element 32 and the components 3, 4. The layer thickness of the further connecting layer 32 may be in the range of a few μm and in particular smaller than 20 μm, particularly smaller than 10 μm. The conversion element 16 may also be introduced into the emission space 15 in the form of a liquid or pasty conversion material and then at least partially, in particular completely, cured. In this embodiment, the conversion element 16 directly adheres to the components 3, 4.

The laser chip 2 may have a reflective embodiment on a rear side 27, which is arranged opposite to the emission side 11, so that the electromagnetic radiation is essentially only emitted via the emission side 11. In the embodiment example shown, the intermediate space 17 between the rear side 27 of the laser chip and second front sides 28, 29 of the components 3, 4 is free of material. In addition, a part of the emission space 15 embodied between the emission side 11 of the laser chip 2 and the conversion element 16 is also free of material.

Depending on the selected embodiment, both the material-free part of the emission space 15 and the material-free part of the intermediate space 17 may be filled with an electrically insulating material. On the emission side 11 of the laser chip 2, the insulating material should be transparent for the electromagnetic radiation 14 of the laser chip 2. On the side or back side 27 of the laser chip 2, insulating material may be provided which is electrically insulating and absorbing for the electromagnetic radiation 14 of the laser chip 2. The insulating material may form an adhesive connection between the components 3, 4 and the laser chip 2.

The components 3, 4 may have an extension in the longitudinal axis along the z-direction e.g. in the range of 2 mm. Furthermore, the intermediate space 17 along the y-axis may have a height of e.g. 0.1 mm. Furthermore, the first recess 18 in the area of the small step 21 may have a depth along the y-axis of e.g. 0.1 mm. Furthermore, the first recess 18 in the area of the large step 22 may have an extension along the y-axis in the range of 0.3 mm. Furthermore, the first recess 18 in the area of the small step 21 may have an extension along the z-axis of for example 0.1 mm. For example, the first recess 18 may extend in a range of 0.02 mm over the emission side 11 to the first side face 5 of the laser chip 2. The first recess 18 may have an extension along the z-axis in the area of the large step 22 in the range of 0.2 mm. Likewise, the second recess 19 may have an extension along the y-axis in the range of 0.2 mm. Furthermore, the second recess 19 may have an extension along the z-axis in the range of 0.2 mm. In addition, the first contact surface 23 and the second contact surface 25 may have a distance of 0.1 mm along the z-axis from the emission side 11 of the laser chip 2. For example, the laser chip 2 may have a length along the z-axis in the range of 1.3 mm. The laser chip 2 may have a height along the y-axis in the range of 0.1 mm. The described sizes are examples. Depending on the realization of the laser component, the sizes may also have different values.

Figure 2:
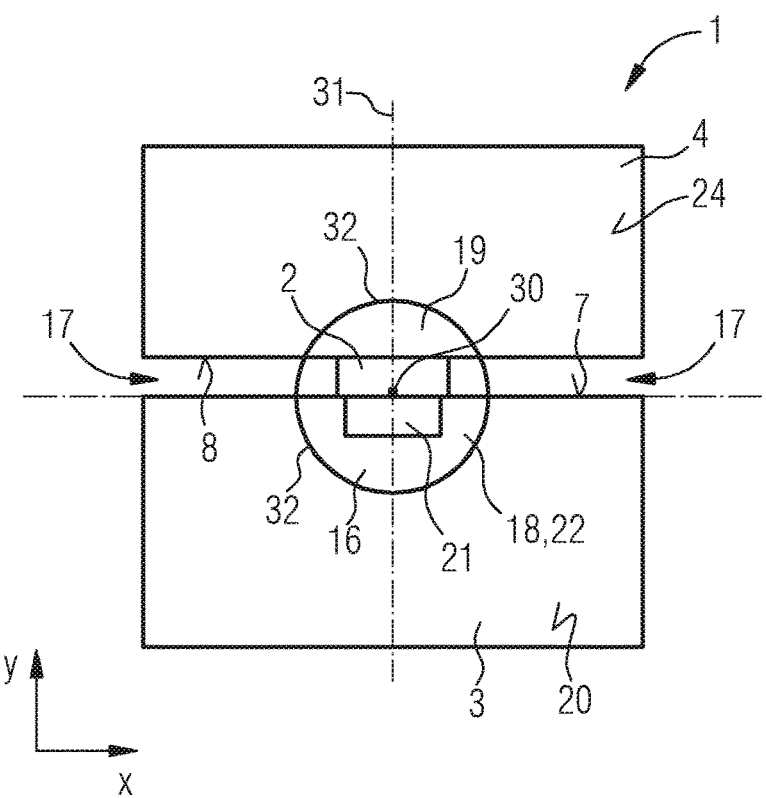
FIG. 2 shows a schematic top view of an emission side of the laser component.

FIG. 2 shows a schematic top view of the first front faces 20, 24 of the components 3, 4 and thus of the emission side of the laser component 1 in the y-x-plane. The first and the second component 3, 4 may have a width along the x-axis in the range of 1 mm. In addition, the first and the second component 3, 4 may have a height along the y-axis in the range of 0.7 mm. For a better overview, the conversion element 16 is displayed transparently. The conversion element 16 has a circular cross section in the y-x plane in the displayed embodiment. Thus, the second recess 19 has a partial disk shape. Likewise, the large step 22 of the first recess 18 has a partial disk shape. The small step 21 of the first recess 18 is a cuboid recess. Depending on the selected embodiment, the small step 21 may also be embodied as a partial disk.

The center of the conversion element 16 is aligned with an emission area 30 of the laser chip 2. The emission area 30 is essentially arranged in the form of an emission point near the first side face 5 of laser chip 2. The emission point 30 lies on a center axis 31 of the laser component 1. The center axis 31 is aligned in parallel to the y-axis. The laser chip 2 has an extension along the x-axis in the range of 0.2 mm.

Figure 3:
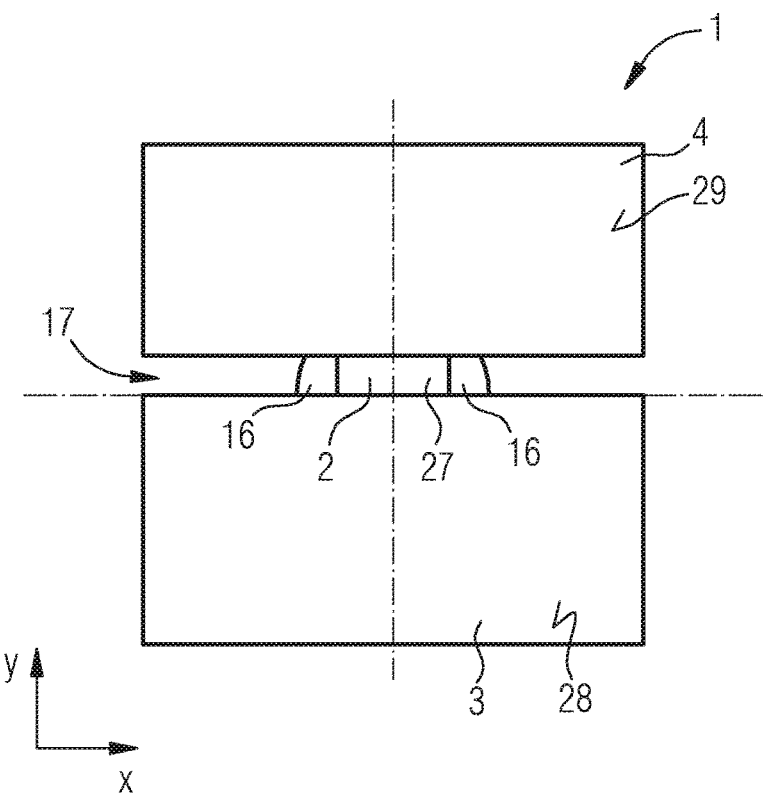
FIG. 3 depicts a schematic top view of a rear side of the laser component.

FIG. 3 shows a schematic rear view of the laser component 1 with a view of the second front faces 28, 29 of the components 3, 4 and with a view of the rear side 27 of the laser chip 2. The conversion element 16 laterally protrudes over the laser chip along the x-axis.

Figure 4:
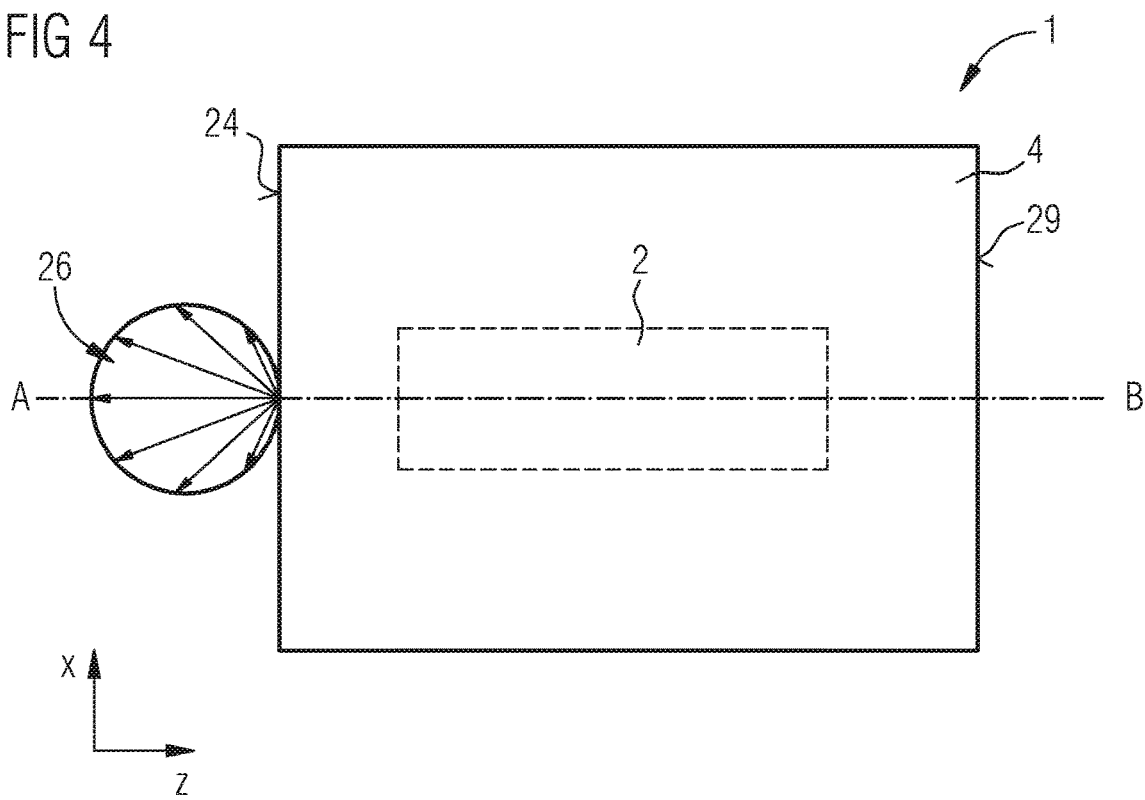
FIG. 4 is a schematic top view of a top side of the laser component.

FIG. 4 shows a schematic top view of the laser component 1 with view of the second component 4. The sectional axis A-B of the cross section of FIG. 1 is indicated. The contour of the laser chip 2 is indicated by a dashed line. The radiation cone of the converted electromagnetic radiation 26 is shown in the form of arrows on the emission side 11 of the laser component 1.

The laser chip 2 is thermally and electrically connected to the first component 3 and the second component 4 via the large-area thermal connection with relatively large heat sinks. The emission direction of the laser chip 2 is perpendicular to the mounting plane, i.e. to the y-x-plane. Depending on the selected embodiment, conversion element 16 may also be omitted. The conversion element 16 is thermally coupled to the first component 3 and the second component 4 with relatively large areas. This ensures good heat dissipation from conversion element 16 to components 3, 4. Depending on the selected embodiment, the conversion element 16 may have the shape of a spherical section, a conical section, a cylindrical section or a pyramid section or combinations thereof. In addition, the conversion element 16 may be mechanically and thermally connected to the first and second components 3, 4 via a further connection layer 32. The further connecting layer 32 may e.g. be in the form of an electrically conduc-tive adhesive or in the form of a solder layer or a sintering layer.

The laser chip 2 may e.g. generate blue laser light and has a power in the range of several watts at a wavelength of 450 nm. The dimensions of the laser chip may e.g. be in the range of (1 mm–3 mm)×(0.1 mm–0.3 mm)×(0.05 mm–0.2 mm). The laser chip 2 e.g. has epitaxially deposited semiconductor layers which form the active zone 12. For example, a light emission width of the laser light along the x-axis may be in the range of 30 μm. The p-contact of the semiconductor chip may face the first component 3. The n-contact of the semiconductor chip e.g. faces the second component 4.

The components 3, 4 may be completely or partially coated or uncoated. For example, components 3, 4 may have a coating of nickel, palladium and/or gold. For the coating of components 3, 4, a current-less deposition such as ENEPIG may be used. Depending on the selected embodiment, the stepped embodiment of the first recess 18 of the first component 3 may be dispensed with and the first recess 18 may be embodied as a single recess which nevertheless extends beyond the emission side 11 of the laser chip 2. Depending on the selected embodiment, the first and second recesses 18, 19 may be dispensed with. This may possibly lead to impairments of the emitted electromagnetic radiation.

The proposed laser component has the advantage that SMT mounting may be carried out in a simple manner. In addition, the light emission is perpendicular to a mounting plane which is predetermined by the second front faces 28, 29 of the components 3, 4. Furthermore, cost-effective materials and processes such as QFN, silver sintering, dispensing, etc. may be used to manufacture the laser component. The proposed laser component may be used for example for a car headlight which particularly has pixels in such a way that pixel areas may be switched off and on in order to not dazzle oncoming vehicles or persons. By means of the proposed embodiment, a laser component with a high luminance laser chip may be used without overheating the conversion element and thus without aging or damaging it too quickly.

Figure 5:
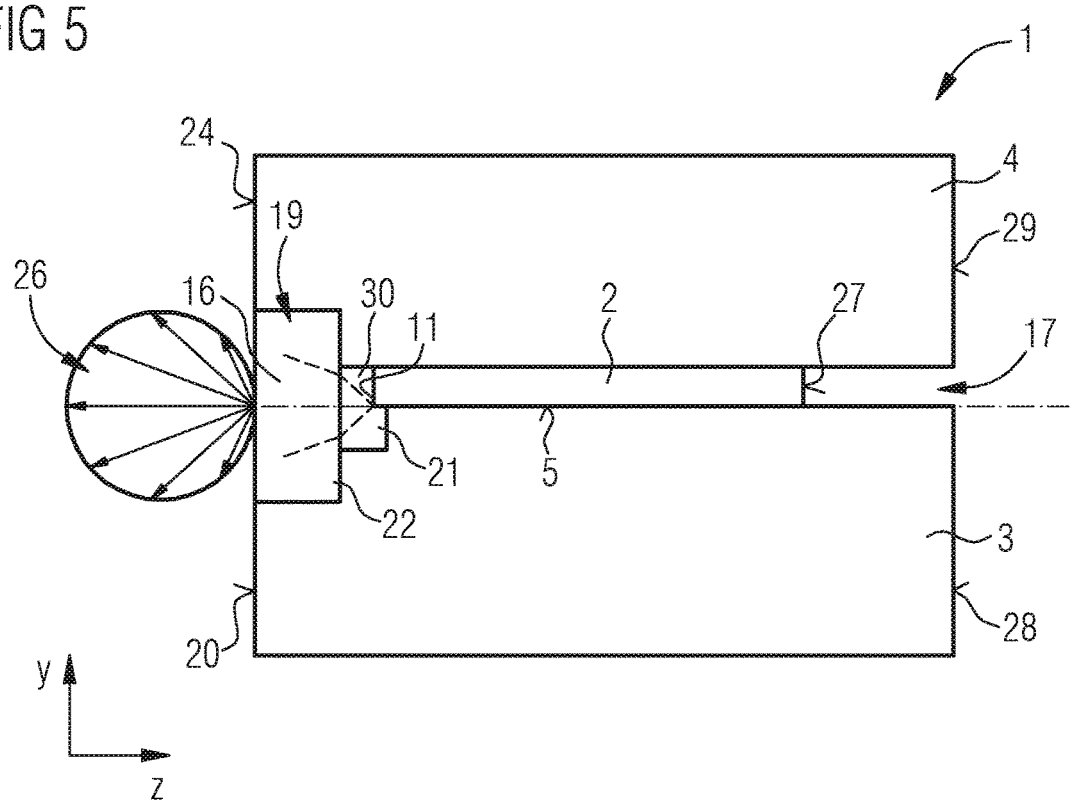
FIG. 5 shows a schematic cross-section through a longitudinal axis of a laser component comprising a laser bar.

FIG. 5 shows a schematic cross-section of a further embodiment of the laser component. The laser component 1 has essentially the same structure as the laser component 1 of FIGS. 1 to 4, however, the laser chip 2 is embodied as a laser bar.

Figure 6:
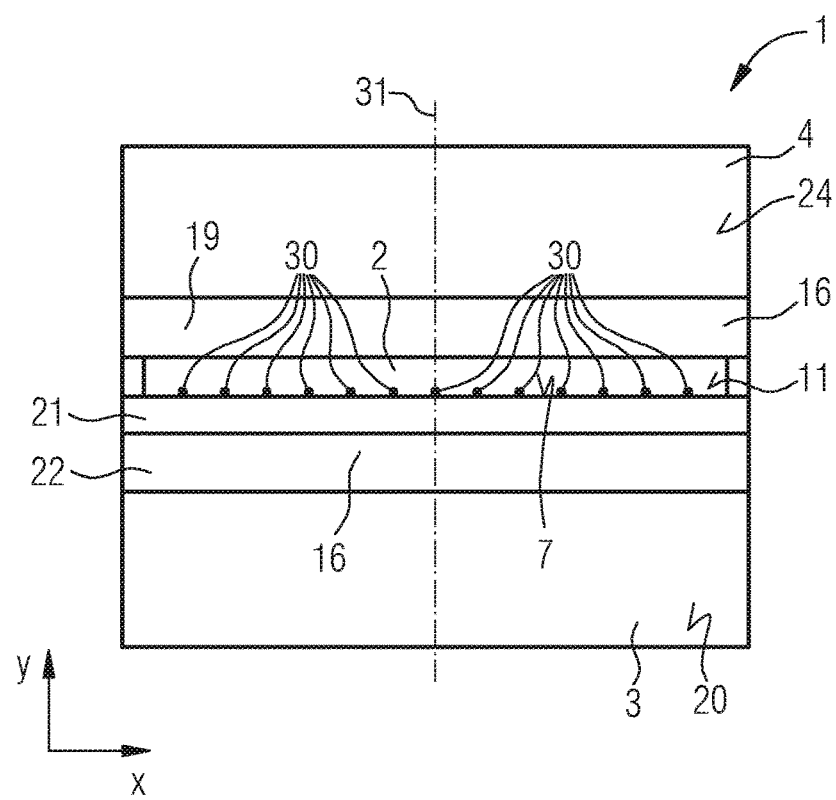
FIG. 6 is a schematic top view of the emission side of the laser component.

FIG. 6, which shows a top view of the emission side of the laser component 1 of FIG. 5, illustrates the embodiment of the laser chip 2 as a laser bar. In the shown embodiment, the conversion element 16 has a rectangular cross-section. This is necessary because the laser chip 2 is embodied as a laser bar. The emission side 11 of the laser chip 2 in the shown embodiment extends along the x-axis over almost the entire width of the components 3, 4 of laser component 1. The laser chip 2 has a large number of emission points 30 arranged next to one another. The conversion element 16 is shown to be transparent. The emission points 30 are arranged adjacent to the first side face 5 of the laser chip 2. The first recess 18 with the small step 21 and the large step 22 extends over the entire width of the components along the x-axis. In addition, the second recess 19 extends over the entire width of the second component 4 along the x-axis.

Figure 7:
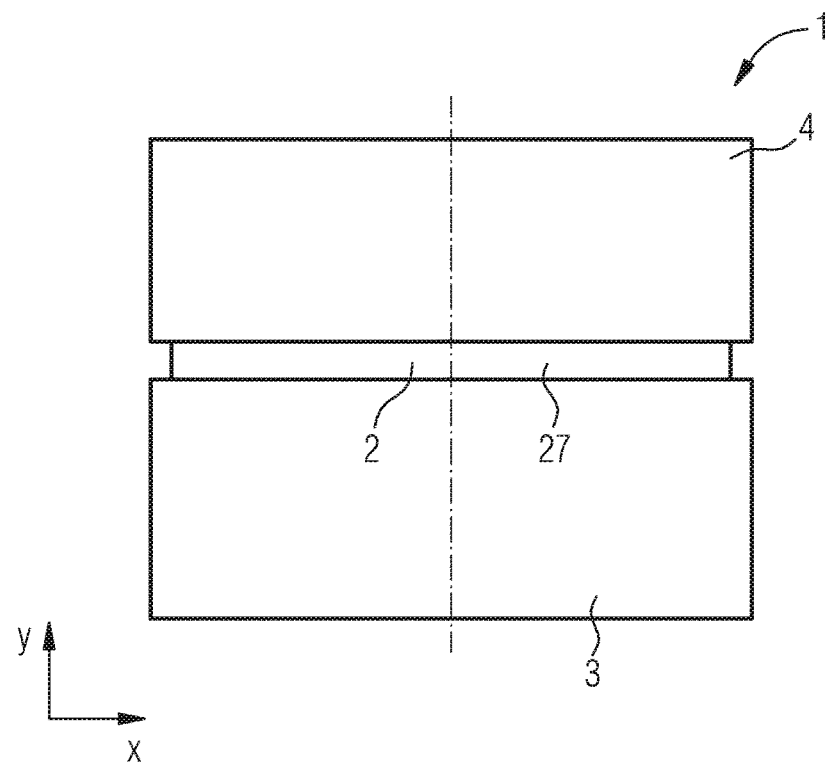
FIG. 7 is a schematic top view of the rear side of the laser component.

FIG. 7 shows a top view of a rear side of the laser component 1, wherein the rear side 27 of the laser chip 2 extends over almost the entire width of the components 3, 4 along the x-axis.

In the embodiments shown in FIGS. 1 to 7, the first components 3 which comprise the first recess 18, may have a greater height along the Y axis compared to the second component 4. The first component 3 may be higher than the second component 4 along the Y-axis by the height of the laser chip 2. Thus, the active zone 12 of the laser chip 2 which is arranged closely to the first component 3 is essentially in the center of the laser component 1 with respect to the Y-axis.

The emission space 15 is symmetrical to the center axis of the laser component 1, as well, with the center axis perpendicular to the Y-axis.

Figure 8:
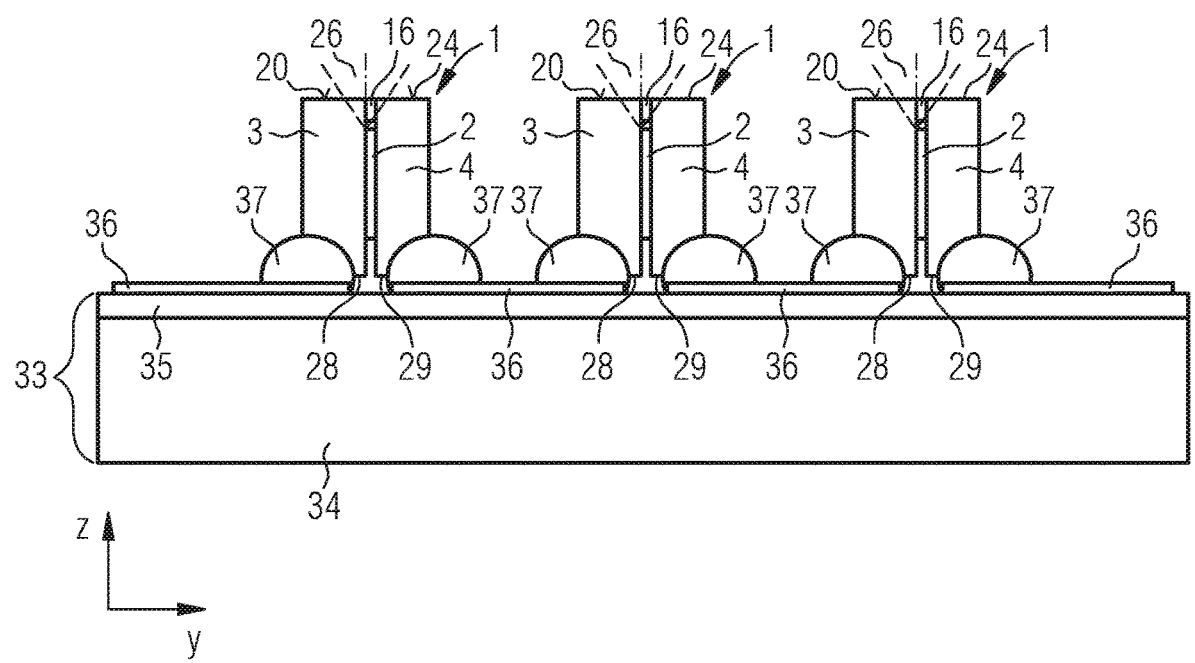
FIG. 8 shows a schematic depiction of a plurality of laser components that are mounted onto a carrier with the components.

In a schematic diagram, FIG. 8 shows a possible SMT mounting of the laser components 1. A carrier 33 is provided. The carrier 33 has a carrier layer 34, an insulation layer 35 deposited on the carrier layer 34, and conductor paths 36 deposited on the insulation layer 35. The carrier layer 34 may e.g. be made of metal and form a metal core of the carrier 33. The insulation layer 35 is made of a dielectric material and serves to electrically insulate the conductor paths 36 from the carrier layer 34.

In the shown embodiment, four conductor paths 36 are depicted, wherein a laser component 1 is electrically and mechanically connected to the conductor paths 36 with second front faces 28, 29 of components 3, 4 via electrically conductive connecting material 37. The connecting material 37 is, for example, in the form of a conductive adhesive or solder. The laser components 1 may be embodied according to one of the embodiment examples described in the previous figures or in the following figures. The emission direction of the electromagnetic radiation emitted by laser components 1 is directed away from carrier 33. In the shown embodiment, the second front faces are arranged opposite to the first front faces. The mounting of the laser components may also be selected in such a way that the laser component is mounted on the carrier with side faces of the components arranged between the opposite front faces. In this embodiment, the direction of radiation of the laser component is not nearly perpendicular to the plane of the carrier, but nearly parallel to the plane of the carrier.

In the shown embodiment example, the three laser components are electrically connected in series. Depending on the selected embodiment, only one single laser component may be provided or more than three laser components may be electrically connected in series. In addition, two or more laser components may also be electrically connected in parallel on the carrier. The carrier 33 may e.g. be embodied in the form of a circuit board with a metal core, wherein the carrier layer 34 forms the metal core.

Figure 9:
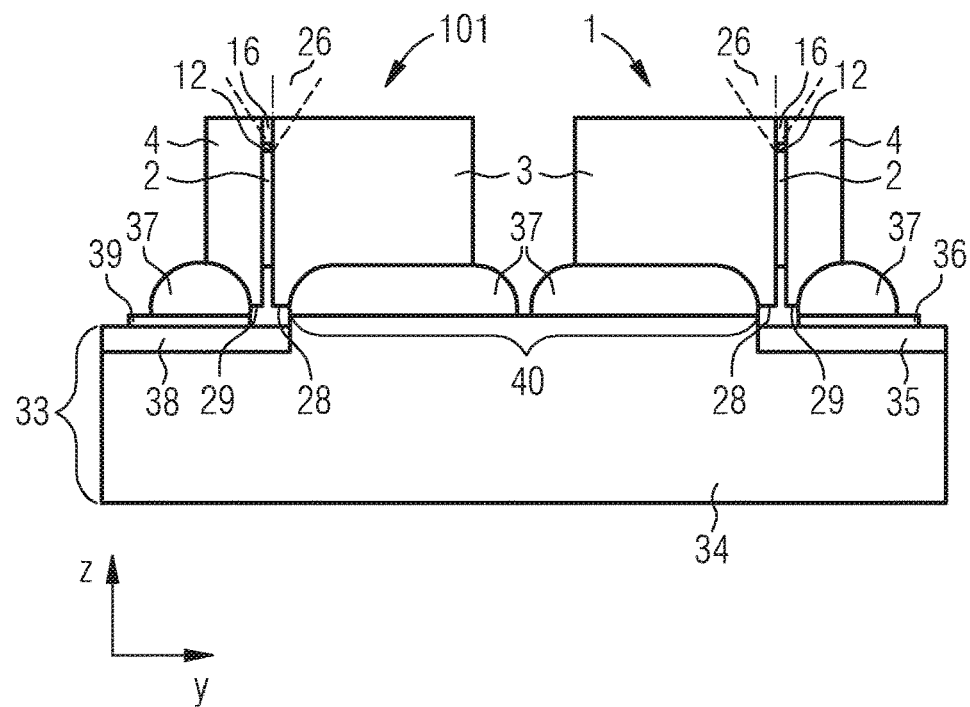
FIG. 9 is a schematic view of a further embodiment of an arrangement of two laser components mounted on a carrier with a metal core.

FIG. 9 shows a further embodiment of a carrier 33 on which two laser components 1 are mounted. In the shown embodiment, the carrier 33 has an electrically conductive carrier layer 34. The electrically conductive carrier layer 34 may e.g. be made of a metal. In contrast to the embodiment shown in FIG. 8, the electrically conductive carrier layer 34 is not completely covered by the electrical insulation layer 35. A free area 40 of the carrier layer 34 is uncovered. An insulation layer 35 is arranged on the carrier layer 34 and another insulation layer 38 is arranged at a distance from it on a top side of the carrier layer 34. The insulation layer 34 and the further insulation layer 38 may be continuous and in one piece or separate and in multiple pieces. A conductor path 36 is arranged on the insulation layer 35. A further conductor path 39 is arranged on the further insulation layer 38.

A first laser component 1 which is embodied according to one of the described embodiments is arranged on the conductor path 36 with a second front face 29 of the second component 4 and is electroconductively connected to the conductor path 36 by means of an electrically conductive connecting material 37. The first component 3 of laser component 1 is arranged above the free area 40 of the carrier layer 34. The second front side 28 of the first component 3 faces the free area 40 of the carrier layer 34. In addition, the first component 3 is electroconductively connected to the free area 40 of the carrier layer 34 via the connecting material 37. In addition, in the shown embodiment, the first component 3 is embodied with a larger volume, in particular with a larger extension along the y-axis, than the second component 4. Thus, the first component 3 has a larger mass and a larger heat capacity than the second component 4. In addition, the first side face 5 of the laser chip 2 is arranged on the first component 3, with the active zone 12 of the laser chip 2 being arranged closer to the first side face 5. Thus, the higher heat capacity of the first component 3 may be used to improve cooling of the active zone 12.

A further laser component 101 is arranged on the carrier 33, wherein the further laser component 101 with the second front faces 28, 29 of the components 3, 4 is arranged on the top side of the carrier 33. Thus, the further laser component 101 also faces the carrier 33 with the rear side 27. The further laser component 101 is electroconductively connected to the second component 4 via an electrically conductive connecting material 37 to the further conductor path 39. In addition, the first component 3 of the further laser component 101 is electrically conductively connected to the free area 40 of the carrier layer 34 via an electrically conductive connecting material 37. Thus, in this embodiment the carrier layer 34 serves both as an electrical conduction connection between the two laser components 1, 101 and as a further heat sink for dissipating heat from the first component 3 of the laser components 1, 101. The carrier 33 may be embodied as a circuit board with a metal core, with the carrier layer 34 forming the metal core.

The laser components of FIGS. 8 and 9 may be embodied in all described embodiments of FIGS. 1 to 7 and 10 to 28. Thus, the mounting types of the laser components described in FIGS. 8 and 9 may be applied to all laser components.

Figure 10:
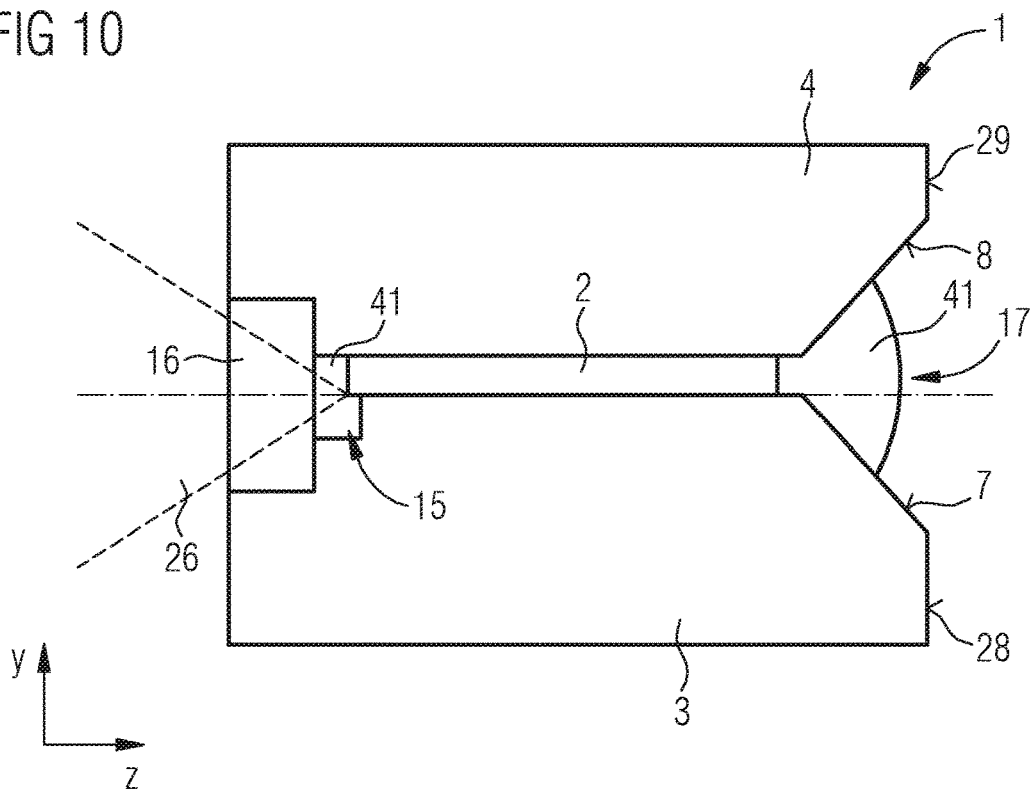
FIG. 10 is a schematic cross-section through a longitudinal axis of a further laser component.

FIG. 10 shows a cross section in the y-z plane along the longitudinal axis through a further embodiment of a laser component 1 which is essentially embodied according to the embodiment of FIGS. 1 to 4. The intermediate space 17 widens in the direction of the second front faces 28, 29 of the components 3, 4. The first side faces 7, 8 of the first and second components 3, 4 are arranged in an area between the rear side 27 of the laser chip 2 and the second front faces 28, 29 of the components 3, 4 at an angle inclined to a z-x plane. In this manner, the distance between the first side faces 7, 8 of the two components 3, 4 increases in the direction of the second front faces 28, 29 of the components 3, 4. In addition, in this embodiment the intermediate space 17 formed between the components 3, 4 and surrounding the laser chip 2 is at least partially filled with an insulating material 41. The insulating material 41 is electrically insulating and transparent for the electromagnetic radiation of the laser chip 2.

In this embodiment, the emission space 15 between the emission side 11 of the laser chip 2 and the conversion element 16 is also filled with the transparent insulating material 41. The insulation material 41 improves the electrical insulation of the second components 3, 4 against voltage flashovers. The insulation material 41 has a higher dielectric strength against voltage flashovers than air. For example, a dielectric material such as silicone, epoxy resin, acrylic paint, etc. may be used as insulation material 41. Other transparent plastics may also be used. By widening the intermediate space 17 on the rear side 27 of the laser chip 2, a reliable, short-circuit-free SMT mounting of the laser component 1 may be guaranteed. Typically, the laser chip 2 has a thickness along the y-axis in the range of 100 µm. This gap requires a precise positioning of the laser components 1 for SMT mounting. By widening the intermediate space 17 adjacent to the second front faces 28, 29 of the components 3, 4, the assembly may be simplified.

Figure 11:
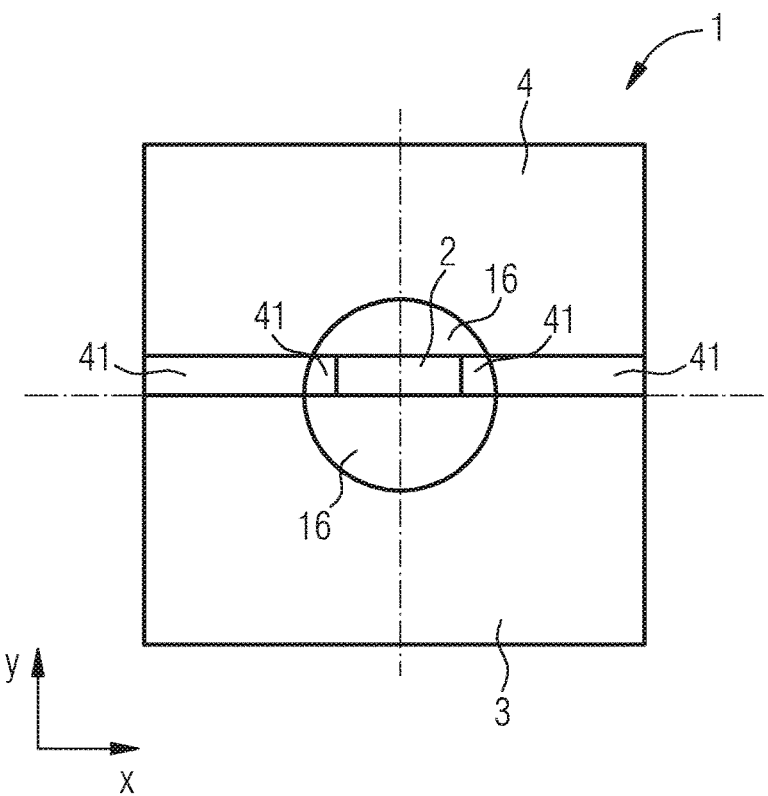
FIG. 11 is a view of the emission side of the laser component of FIG. 10.

FIG. 11 shows a schematic top view of the emission side of laser component 1. The conversion element 16 is shown as transparent. The intermediate space 17 is also filled with the insulating material 41 on the side of the laser chip 2.

Figure 12:
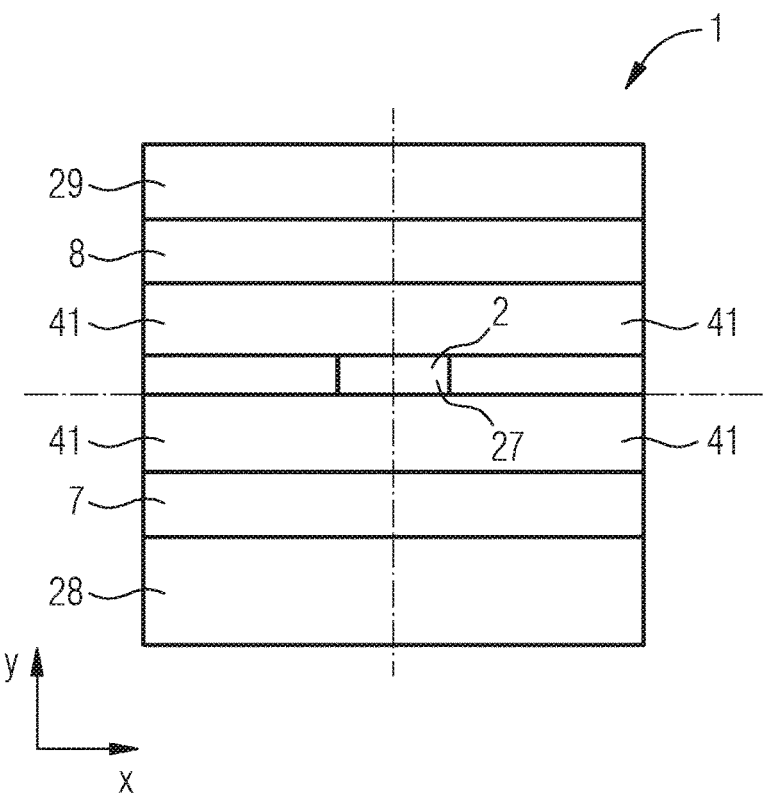
FIG. 12 shows a view of the back of the laser component of FIG. 10.

FIG. 12 shows a schematic view of the rear side of the laser component 1 with the electrically insulating material 41 extending in the form of a strip across the entire width along the x-axis of the laser component 1.

The embodiment of the laser component 1 of FIGS. 10 to 12 is particularly suitable for mounting on a carrier as described in FIGS. 8 and 9.

Figure 13:
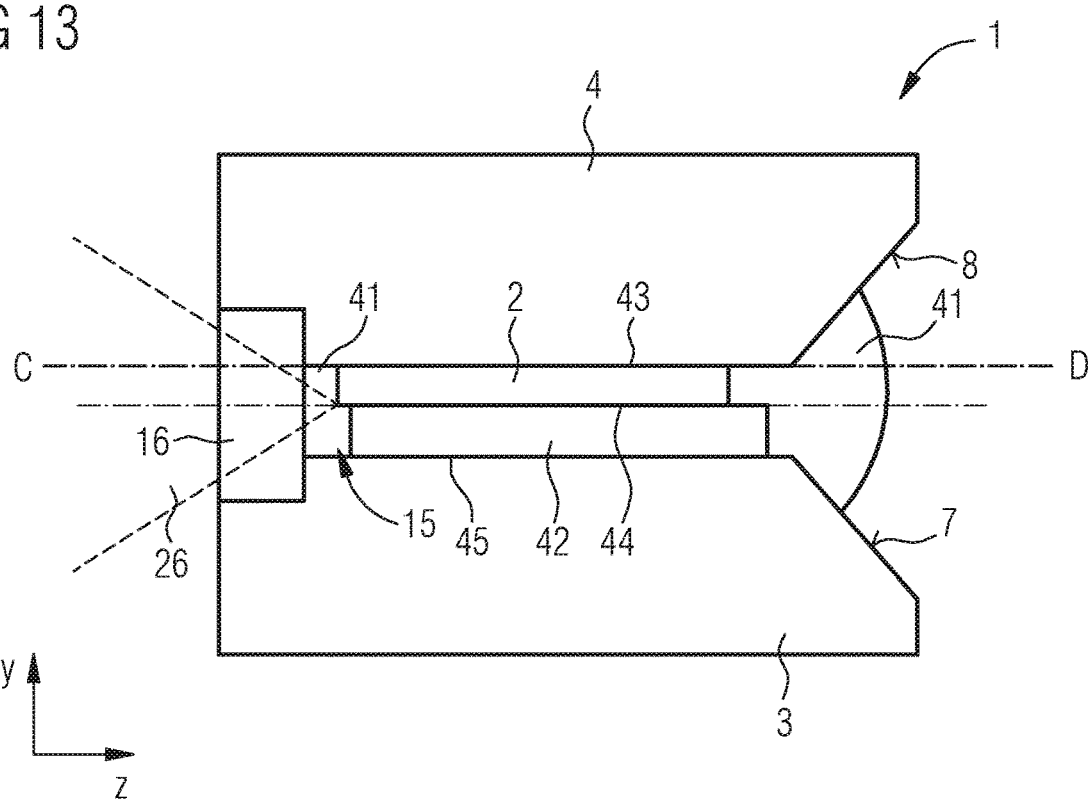
FIG. 13 shows a schematic cross-section through a longitudinal axis of a further embodiment of a laser component comprising a further component.

FIG. 13 shows a schematic cross section of a further embodiment of a laser component 1. The laser component 1 is essentially embodied according to the laser component of FIG. 10. In contrast to the embodiment of FIG. 10, however, in this arrangement a further component 42 is arranged between the laser chip 2 and the first component 3. The further component 42 is also made of an electrically conductive material which also has a good thermal conductivity. The further component 42 serves to establish the electrical and thermal connection between the laser chip 2 and the first component 3. In addition, the further component 42 has the object of balancing different thermal expansion coefficients between the laser chip 2 and the first component 3. For example, the first component 3 may be made of copper and have a high coefficient of thermal expansion of approx. 18 ppm/K. The coefficients of expansion of semiconductor materials and substrates such as those found in laser chip 2 are typically below 10 ppm/K. This may result in a high stress for the laser chip which is e.g. higher at a higher temperature for the connection, particularly for a soldered connection, than for an adhesive connection or a sintered assembly of the laser chip 2 with the first component 3 and the second component 4. In this embodiment, as well, the laser chip 2 with the emission side 11 protrudes over the further component 42 along the z-axis in the direction of the emission side of the laser component 1. This ensures that the emission of the electromagnetic radiation is not impaired by the further component 42. The further component 42 may have the same thickness along the Y-axis as the laser chip 2. In addition, the first component 3 and the second component 4 may each have identical recesses 18, 19, which limit the emission space. Thus, the active zone 12 of the laser chip 2 is arranged at the center of the emission space 15 with respect to the Y-axis.

Depending on the selected embodiment, the laser chip 2 may be connected to the first component 3, the second component 4 or the further component 42 via an adhesive layer, a sinter layer or a solder layer such as a gold-tin solder layer. Sim-ilarly, the further component 42 is connected to the first component 3 via a solder layer, an adhesive layer or a sintered layer. FIG. 13 schematically shows corresponding connecting layers 43, 44, 45. To reduce the thermal expansion stress between the laser chip 2 and the components 3, 4, the further component 42 has a thermal expansion coefficient which lies between the thermal expansion coefficient of component 3 and the thermal expansion coefficient of the laser chip 2.

For example, the further component 42 may consist of aluminum nitride, aluminum oxide, a copper-tungsten, copper-diamond or silicon carbide. In addition, it may be advantageous during assembly if the additional component 42 already has corresponding connecting layers on the top and bottom side, particularly solder layers such as a gold-tin layer, adhesive layers or sintered material. This makes the assembly easier to perform.

Figure 14:
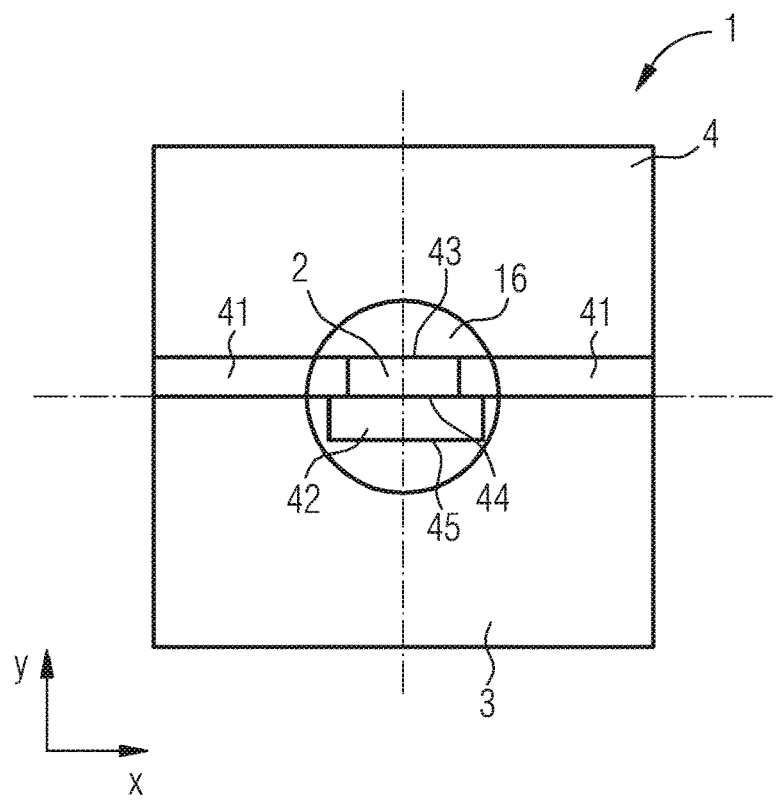
FIG. 14 is a schematic top view of an emission side of the laser component of FIG. 13.

FIG. 14 shows a top view of the emission side of the laser component 1 of FIG. 13, which corresponds to the view in FIG. 11.

Figure 15:
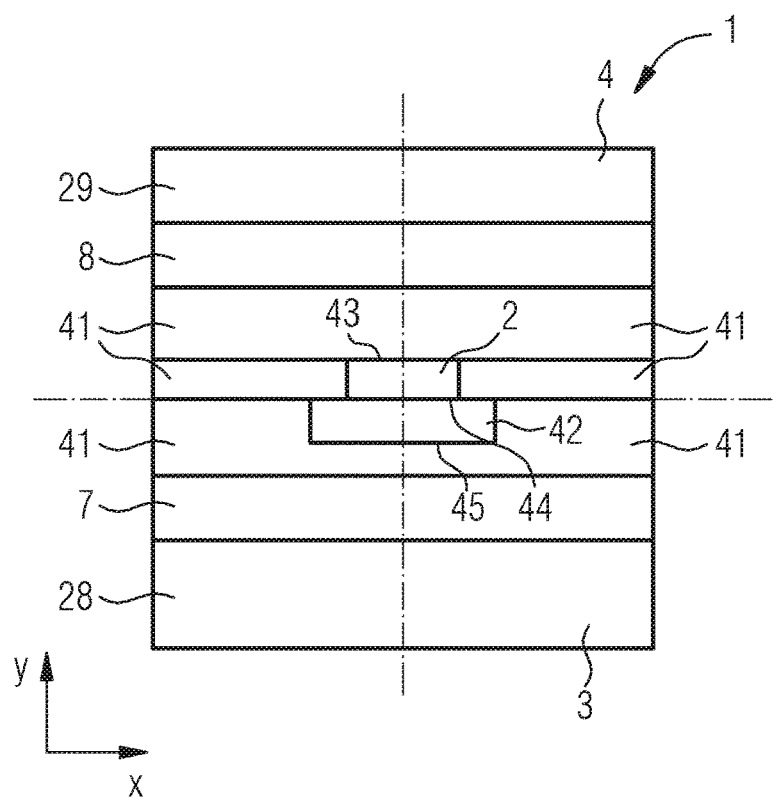
FIG. 15 depicts a schematic top view of a rear side of the laser component.

FIG. 15 shows a view of the rear side of the laser component 1 of FIG. 13. In this view, the insulation material 41 is shown transparent. Thus, the contour of the remaining component 42 and the contour of the laser chip 2 are visible. In the shown embodiment, the further component 42 has a larger width along the x-axis than the laser chip 2. Thus, a better heat dissipation from laser chip 2 to the first component 3 may be achieved.

Figure 16:
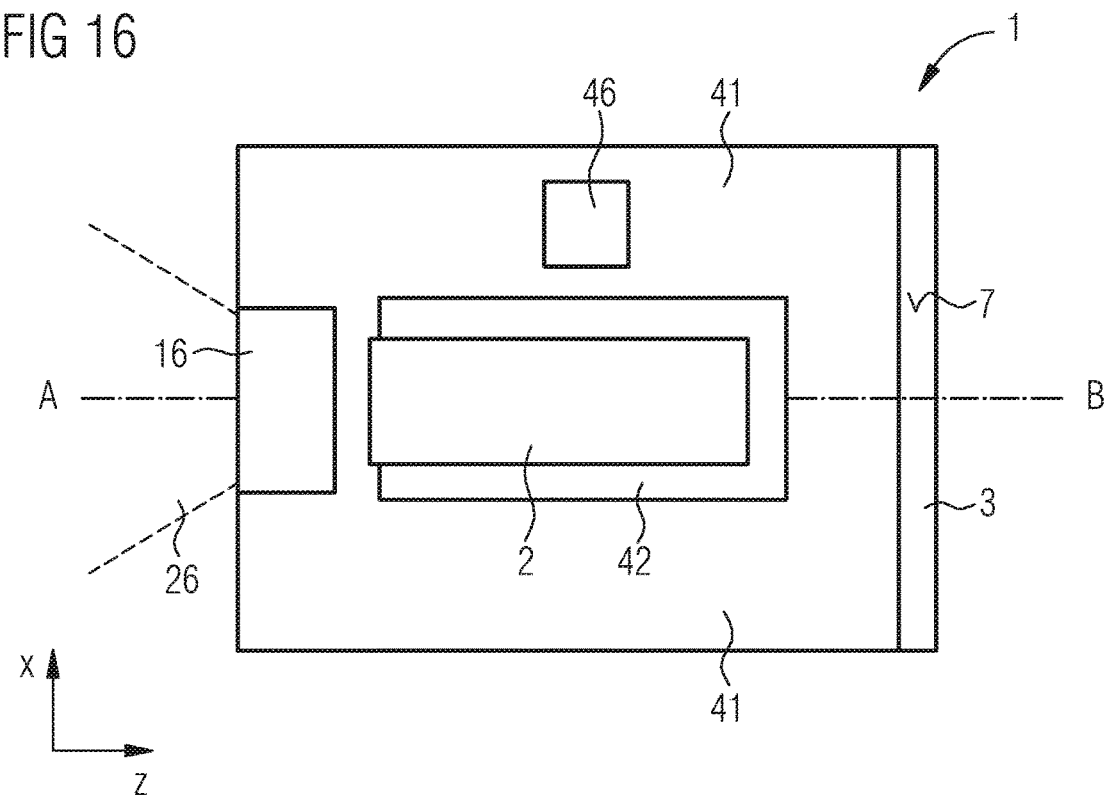
FIG. 16 is a schematic cross-section through the laser component of FIG. 13 at the level of the laser chip.

FIG. 16 shows a schematic cross-section along the line C-D of FIG. 13. At the same time, FIG. 16 shows the sectional line A-B of FIG. 13. In this embodiment, as well, the insulation material 41 is shown transparent, rendering the contour of the remaining component 42 visible. The further component 42 has a larger length along the z-axis in the direction of the rear side of laser component 1 than the laser chip 2. In the shown embodiment, a protective diode 46 is provided between the first and second component 3, 4. The protective diode 46 is electrically connected to the first component 3 and the second component 4. The protective diode 46 serves to prevent damage to the laser chip 2 when high voltage is applied in the reverse direction of the laser chip 2. In particular, the protective diode 46 may prevent electrostatic discharges which could result in the destruction of the laser chip 2. Corresponding protective diodes may be used with all described embodiments of the laser component.

Figure 17:
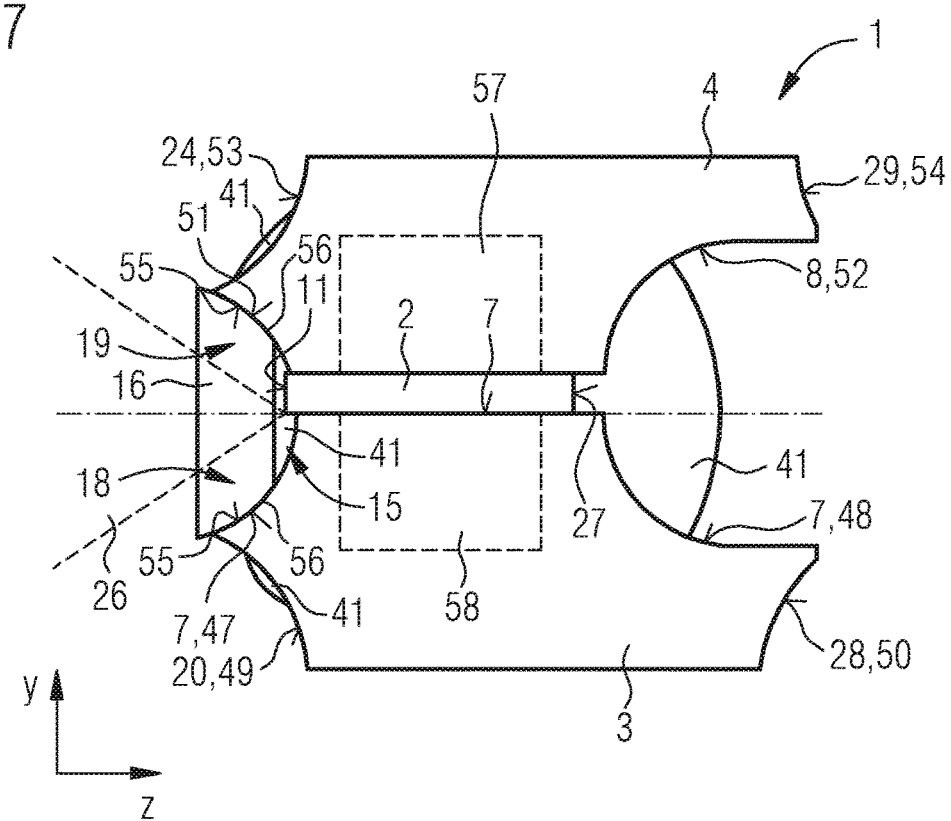
FIG. 17 is a schematic cross-section along a longitudinal axis through another embodiment of a laser component comprising components with etched recesses.

FIG. 17 shows a schematic cross section along a longitudinal axis through a further embodiment of a laser component 1 which is essentially embodied according to the embodiment shown in FIG. 10. In contrast to the embodiment of FIG. 10, the first and the second component 3, 4 were at least partially formed by means of etching processes. The first and the second component 3, 4 may be formed from a lead-frame section.

The first side face 7 of the first component 3 has a first etched partial surface 47 in the area in front of the emission side 11 of the laser chip 2, which delimits the first recess 18 of the first component 3 and thus limits the emission area 15. In addition, the first component 3 has a second etched partial surface 48 in the area behind the rear side 27 of the laser chip 2 in the first side area 7. In the shown embodiment, both the first partial surface 47 and the second partial surface 48 are embodied as partially spherical surfaces. In addition, the first component 3 has a third partial surface 49, which forms a first front face 20 of the first component 3. Furthermore, the first component 3 comprises a fourth partial surface 50 which forms a second front face 28 of the first part 3. The third and fourth partial surface 49, 50 also have the shape of a partially spherical surface. The first, second, third and fourth partial surfaces 47, 48, 49, 50 are e.g. produced by an etching process.

In the embodiment example shown, the second component 4 is identical to the first component 3. Thus, the second component 4 also has a further first partial surface 51 which delimits the second recess 19 which also delimits the emission space 15. The further first partial surface 51 is embodied corresponding to the first partial surface 47. Depending on the selected embodiment, the first and further first partial surfaces 47, 51 may in combination essentially form a hemispherical surface. In addition, the further first partial surface 51 along the Y-axis may be made smaller by the height of the laser chip 2. This ensures that the active zone 12 of the laser chip 2 arranged closely to the first partial surface 47, is located in a center of the emission space 15 formed by the first partial surface 47 and the further first partial surface 51.

Furthermore, the second component 4 has a further second partial surface 52. The further second partial surface 52 has the same embodiment as the second partial surface 48. In addition, the second component 4 has a third partial surface 53. The further third partial surface 53 is embodied like the third partial surface 49. In addition, the second component 4 has a further fourth partial surface 54. The further fourth partial surface 54 has the same embodiment as the fourth partial surface 50. The first and the second component 3, 4 are arranged mirror-symmetrically with regard to each other, wherein the laser chip 2 is located between the two components 3, 4. Depending on the selected embodiment, the first component 3 and the second component 4 may also have different shapes. However, the identical embodiment of the first and second components 3, 4 simplifies the manufacture of the components.

The laser chip 2 protrudes into the emission space 15 with its emission side 11. A conversion element 16 is arranged in the emission space 15. The conversion element 16 is arranged at a distance from the emission side 11 of the laser chip 2. The conversion element 16 has a semi-spherical embodiment, with a ring-shaped circumferential semi-spherical surface 55 matching the semi-spherical surface of the first partial surface 47 and the further first partial surface 51. In addition, the conversion element 16 may be connected to the first and second components 3, 4 in the area of the partial sphere surface 55 in a mechanically and thermally conductive manner by means of a fourth connecting layer 56. Like the other connecting layers, the fourth connecting layer 56 may e.g. consist of an adhesive material, sintering material such as a sintering paste e.g. of silver or a solder e.g. of gold-tin.

An optically transparent insulating material 41 may be arranged between the emission side 11 of the laser chip 2 and the conversion element 16. The first and second components 3, 4 may be embodied as lead-frame sections and have webs 57, 58 on the sides. The webs 57, 58 are schematically indicated by dotted lines.

The use of components 3, 4 with etched partial surfaces offers the advantage that the partial surfaces may be produced in differing shapes. In addition, the etched partial surfaces may be used to create a relatively large contact area between the conversion element and components 3, 4. This improves heat dissipation between the conversion element and the components 3, 4. Furthermore, the etched first and further first partial surfaces 47, 51 may be used to provide an optimized shape of the emission space 15. Thus, the emission space 15 may be embodied relatively small so that a relatively small conversion element 16 is sufficient for the conversion of the electromagnetic radiation of the laser chip 2. In this embodiment, as well, the emission side 11 of the laser chip 2 protrudes into the emission space 15, so that a shading of the electromagnetic radiation of the laser chip 2 by the first and/or the second component 3, 4 is avoided.

The first partial surface 47 and the further first partial surface 51 may e.g. also have the shape of a partial cone surface, a partial pyramid surface, a partial cylinder surface. As a result, optimized shapes of the emission space 15 may be provided. In these embodiments, as well, the first and the further first partial surfaces 47, 51 may be asymmetri-cally embodied by the height of the laser chip along the Y axis, so that the active zone 12 of the laser chip 2 is arranged in the center of the formed emission space. In addition, the components 3, 4 may be produced quickly and cost-effectively by means of etching processes, in particular dou-ble-sided etching processes. For example, components 3, 4 may be embodied as semi-etched QFN lead frames.

By isotropic, wet chemical etching of the material of the components 3, 4, which may e.g. be metal, particularly copper, round etching edges are produced. At the emission side 11 of the laser chip 2, the rounded etch edges may be used to avoid light shading together with a projecting of the laser chip 2.

The conversion element is formed in such a way that the surface of the conversion element has essentially the same shapes as the etched shapes of the first partial surface 47 and the further first partial surface 51 and thus lies well flat against the first partial surface 47 and the further first partial surface 51. Due to the good adaptation of the surface of the conversion element 16 to the first and further first partial surfaces 47, 51, a relatively large surface of the conversion element is connected to the components 3, 4 which act as heat sinks. Since a heat loss mainly occurs in the center of the conversion element 16, it is advantageous if the center of the conversion element is arranged relatively closely to the components 3, 4. This condition is well achieved, for example, by forming a semi-spherical emission space or a pyramid-shaped emission space. Also the formation of a cylindrical emission space provides a close arrangement of the center of the conversion element 16 at the components 3, 4 at least in one spatial direction. To connect the conversion element 16 and the components 3, 4, processes such as soldering, sintering or gluing may be used. In addition, materials such as gold-tin, tin-silver-copper, tin, indium-tin, nanosilver sintering paste, silver ink, silver flake paste may be used.

The webs 57, 58 result from the embodiment of the lead frames, wherein the lead-frame sections are held together by the webs. The webs are cut when the lead-frame sections are singulated. Typically, a cutting-off process (sawing) may be used for this purpose. Since metals, such as copper, are very soft, ridges are produced. Ridges may lead to the danger of electrical short circuits between the two components 3, 4 of a laser component.

Figure 18:
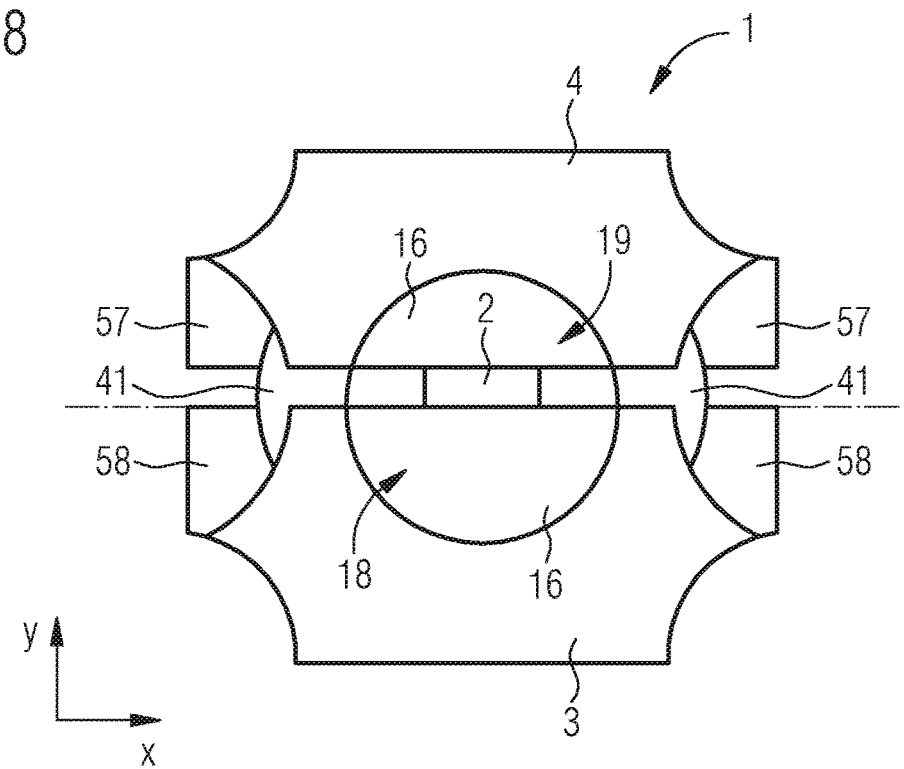
FIG. 18 depicts a schematic view of the emission side of the laser component of FIG. 17.

FIG. 18 shows a top view of an emission side of the laser component 1 of FIG. 17.

Figure 19:
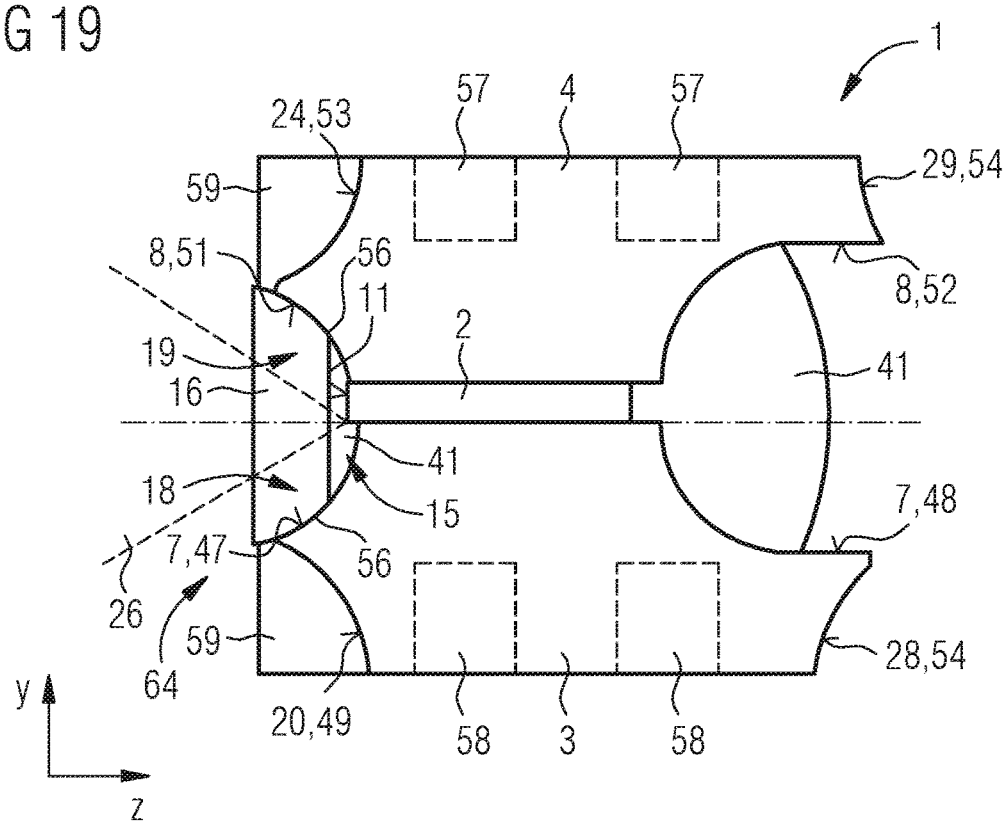
FIG. 19 shows a schematic cross-section along a longitudinal axis of a further embodiment of a laser component with covering material.

FIG. 19 shows a schematic cross-section along the longitudinal axis through laser component 1 which is essentially embodied according to the embodiment of FIGS. 17 and 18. The webs 57, 58 are shown as dashed lines. The laser component 1 in FIG. 19 additionally comprises a cover layer 59 which covers the third partial surface 49 and the further third partial surface 53 of the first and second components 3, 4. As a result, ridges or edges of the partial surfaces are covered. This reduces or prevents the risk of an electrical short circuit between components 3, 4. In addition, the insulation layer 41 in the area of the rear side 27 of the laser chip 2 may e.g. be made of a harder material than in the area of the emission space 15 between the conversion element 16 and the emission side 11 of the laser chip 2. In addition, the insulation layer 41 in the area of the rear side 27 of the laser chip 2 may e.g. be formed from a non-transparent material. In contrast, the insulating material 41 in the area of the emission space 15 between the conversion element 16 and the emission side 11 of the laser chip 2 is formed of a transparent material.

The cover layer 59 may e.g. comprise epoxy resin or silicone which is provided with covering material. For example, quartz glass (fused silica) may be used as a covering material. For example, the carrier material of the cover layer 59, which may be silicone or epoxy resin, may contain at least 50% by volume of cover material. The material of the cover layer 59 may be applied to components 3, 4 or into the recesses of the components 3, 4 by dispensing or in-mold processes such as injection molding or thermo-forming. In addition, it may be advisable to embody the components 3, 4 in such a way that the webs 57, 58 of the components 3, 4 assembled with each other are as far apart as possible to prevent electrical flashovers.

The use of different materials for the emission space 15 and the further area of the laser component 1 as an insulation material or as a cover layer has the advantage that the two different materials may be optimally selected for the different objects. For example, for a blue laser light, mainly silicones may be used as transparent materials for the insulation material 41. However, these have a lower adhesion to many materials and a relatively high coefficient of expansion. Consequently, the mechanical component stability of the laser component may be improved by using a different material for the areas outside of the emission space or for the cover layer 59. Depending on the chosen embodiment, the insulating material 41 may also be used for the mechanical and thermal connection between the conversion element 16 and the first partial surface 47 or the further first partial surface 51. However, the thinnest possible layer thickness should be used for this purpose, since the thermal conduction of silicones is relatively low.

Figure 20:
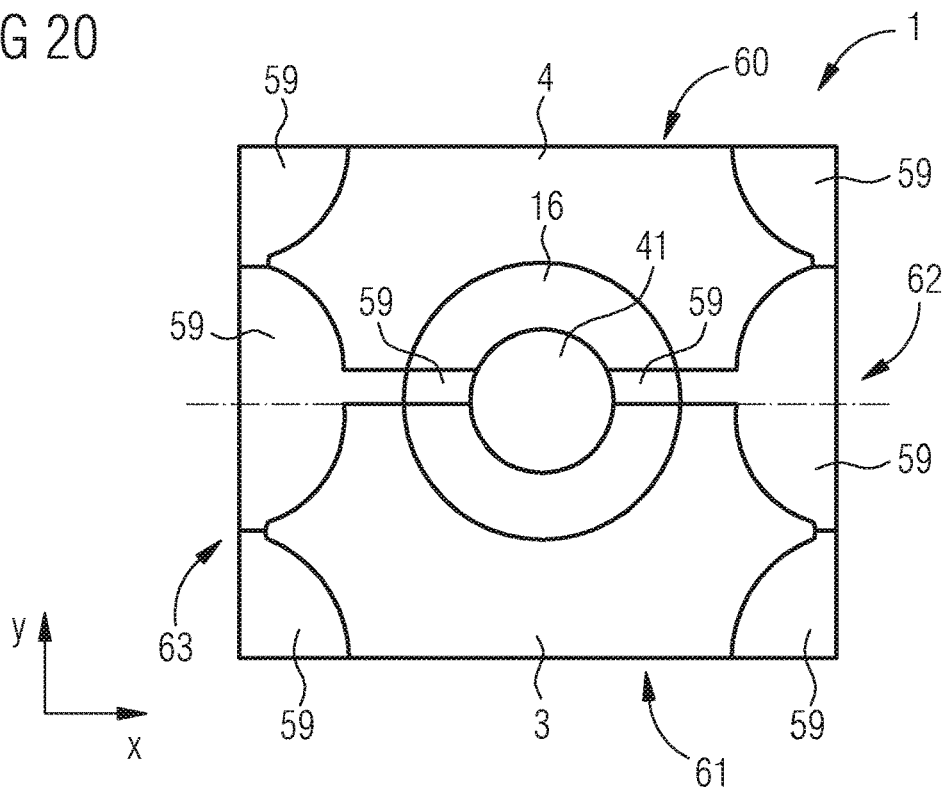
FIG. 20 shows a schematic top view of the emission side of the laser component of FIG. 19.

FIG. 20 shows a view of the emission side of the laser component 1 of FIG. 19, showing that the cover layer 59 also covers side areas of the first and second components 3, 4. The cover layer 59 is laterally guided so far that the existing webs 57, 58 are covered, as well. Thus, laser component 1 has a flat surface on a top side 60, a bottom side 61, a first side face 62 and a second side face 63. The flat surface is formed by the cover layer 59 and the surfaces of the first and second component 3, 4.

The cover layer 59 may be made of the same material as the insulation material 41, and the cover layer 59 may also be made of a different material than the insulation material 41 which is arranged in the emission space 15. Outside of the emission space 15, it is not necessary that the material of the cover layer 59 is transparent for electromagnetic radiation. In addition, it may be advantageous that the material of the cover layer 59 outside of emission space 15 has a greater hardness or strength than the insulation material 41 in the emission space 15. In this manner, a more stable connection may be created between components 3, 4 and the laser chip 2. In addition, the laser component 1 may be better protected against mechanical damage due to the greater hardness of the cover layer 59.

Figure 21:
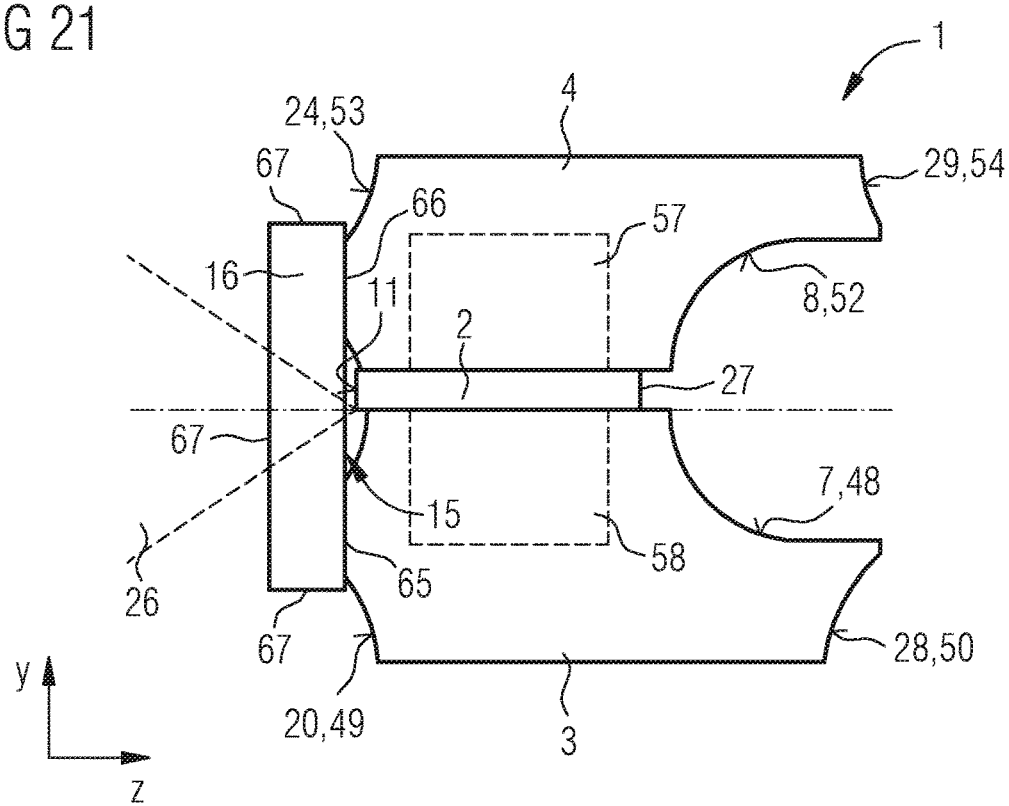
FIG. 21 is a schematic cross-section along a longitudinal axis through another embodiment of a laser component having a conversion element on the first front faces of the components.

FIG. 21 shows a schematic cross section along the longitudinal axis through a further embodiment of a laser component 1, which is essentially embodied according to the laser component of FIG. 17. Components 3, 4 and the laser chip are embodied according to FIG. 17. However, in this embodiment, the insulation material 41 is dispensed with. The insulation material 41 is also not required for the embodiment of FIG. 17. Furthermore, the first front face 20 of the first component 3 and the first face 24 of the second component 4 each have a flat contact surface 65, 66.

The first front faces 20, 24 of the components 3, 4 may be planarized after etching by means of a mechanical forming process such as pressing, punching or by means of a machining removal process such as diamond milling. As a result, plane first and second contact surfaces 65, 66 may be produced on the first front face 20 of the first component 3 and on the first front face 24 of the second component 4. A plate-shaped conversion element 16 may be attached to these flat support surfaces 65, 66. In this embodiment, too, an emission space remains into which the emission side 11 of the laser chip 2 projects.

The conversion element 16 may be connected to components 3, 4 using the processes and materials described above. For this purpose, processes such as soldering, sintering or gluing may be used. In addition, gold-tin, tin-silver-copper, tin, indium-tin, nanosilver sintering paste, silver ink or silver flake paste may be used as materials for the connection layers.

The plate-shaped conversion element 16 may be without housing or provided with a frame 67. The frame 67 surrounds the plate-shaped conversion element 16 all around on the outside. The frame 67 stabilizes the conversion element 16 and may additionally be in contact with the first front faces 20, 24 of the components 3, 4 and thus provide improved heat conduction to the first and second component 3, 4. The frame 67 may e.g. be made of metal such as copper and aluminum and be provided with an insulating layer to prevent an electrical short circuit between the first and second component 3, 4. In this context, the insulation layer is arranged between the frame 67 and components 3, 4. The frame may also be made of silicon, glass, aluminum oxide or an aluminum nitride ceramic. If the frame 67 is made of an electrically insulating material, an additional insulating layer for the frame 67 is not necessary.

Figure 22:
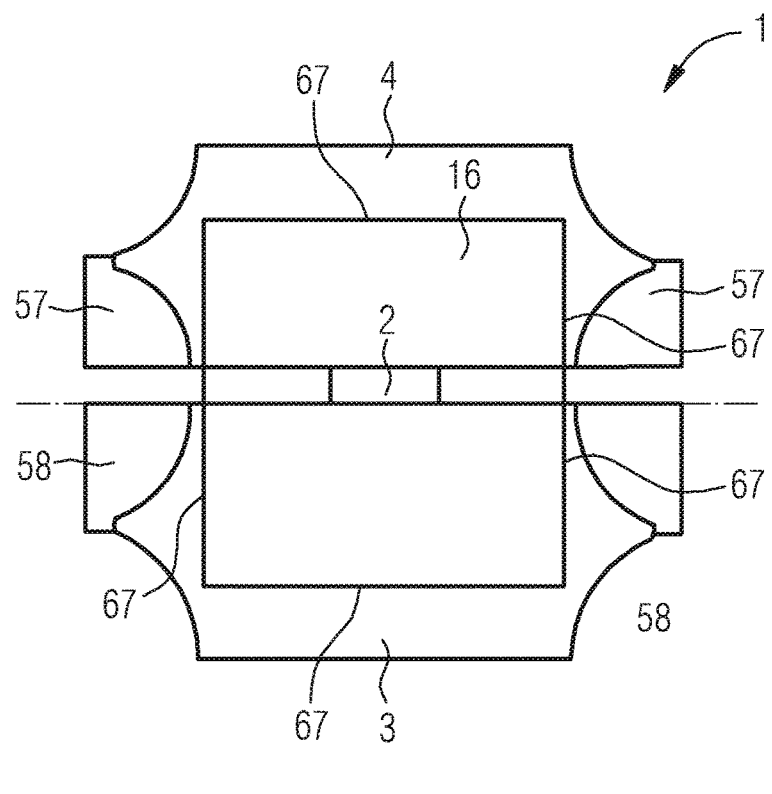
FIG. 22 shows schematic top view of the emission side of the laser component of FIG. 21.

FIG. 22 shows a schematic top view of the arrangement of FIG. 21.

Figure 23:
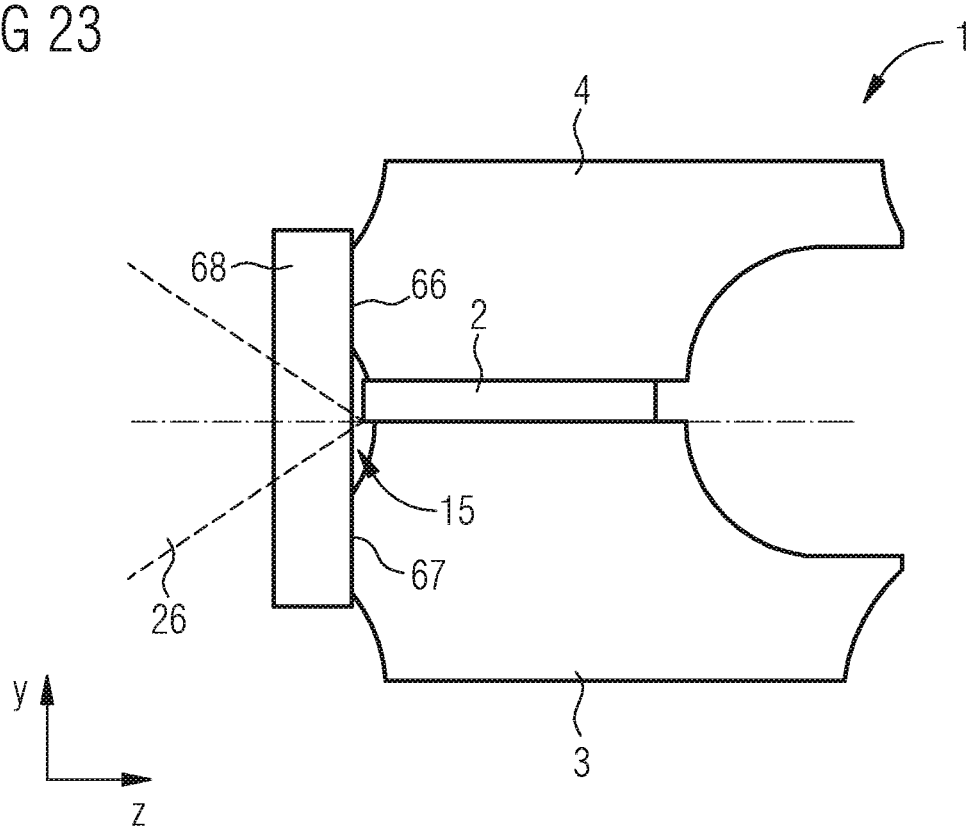
FIG. 23 is a schematic cross-section along a longitudinal axis through a further embodiment of a laser component with a front-face plate.

FIG. 23 shows a schematic depiction of a cross section along the longitudinal axis through a further embodiment of a laser component 1, wherein the laser component 1 is essentially embodied according to the embodiment of FIG. 21. However, in contrast to the embodiment of FIG. 21, instead of a conversion element 16, a transparent plate 68 is provided on the emission side and connected to the flat contact surfaces 65, 66 of the components 3, 4. The plate 68 may be transparent or scattering. For example, the plate 68 may be made of glass or comprise glass.

The conversion element 16 may have different conversion materials for all embodiments depending on the desired light. For example, an yttrium-aluminum garnet doped with cerium may be used for cold white light. This yellow luminescent material may be used in combination with a blue laser light in order to produce white light. Depending on the desired color of the light, different materials may be used to dope the yttrium-aluminum-garnet. For example, various lanthanoids such as ne-odymium or erbium may be used.

In addition, the laser chip 2 may generate a laser light with differing wavelengths, particularly red laser light, green laser light or blue laser light, depending on the selected embodiment. Analogously, red conversion elements, green conversion elements or yellow conversion elements may be used. For example, the proposed laser component may be used in pro-jection systems. There, too, high luminances are required. For the blue light of the laser chip a transparent or scattering plate 68 may be used. In addition, plate 68 may also be dispensed with. Alternatively, it is also possible to in-stall laser chips 2 emitting directly in the desired colors, i.e. laser diodes in this housing form, for example, and thus obtain the light directly from the laser chip 2. In projec-tors, laser components with different colors red, green and blue are used, since the different colors are modulated sepa-rately to produce an image. These statements also apply to the embodiment of the laser chip 2 in the form of a laser bar. The laser bar has several emission areas. For example, the laser bar may have a width of 2 mm and at a distance of 0.2 mm it may have 30 µm-wide emission areas, respectively. By means of the laser bar, the output power of the laser component may be significantly increased.

The embodiments of FIGS. 21 to 23 may also be realized with the embodiments of the laser components of FIGS. 1 to 20.

In the embodiments of FIGS. 10 to 23, the first component 3 comprising the first recess 18 may have a larger height along the Y axis compared to the second component 4. The first component 3 may be higher along the Y-axis by the height of the laser chip 2 than the second component 4. Thus, the active zone 12 of the laser chip 2 arranged closely to the first component 3 is essentially in the center of the laser component 1 with regard to the Y-axis. The emission space 15 is symmetrical to the center axis of the laser component 1, as well, with the center axis perpendicular to the Y-axis.

Depending on the selected embodiment, the first and further first partial surfaces 47, 51 may in combination essentially form a hemispherical surface in the embodiments of FIGS. 17 to 23. In addition, the further first partial surface 51 may be smaller than the first partial surface 47 by the height of the laser chip 2, thus ensuring that the active zone 12 of the laser chip 2, which is located closely to the first partial surface 47, is arranged in a center of the emission space 15, which is formed by the first partial surface 47 and the further first partial surface 51, with regard to the Y-axis.

Figure 24:
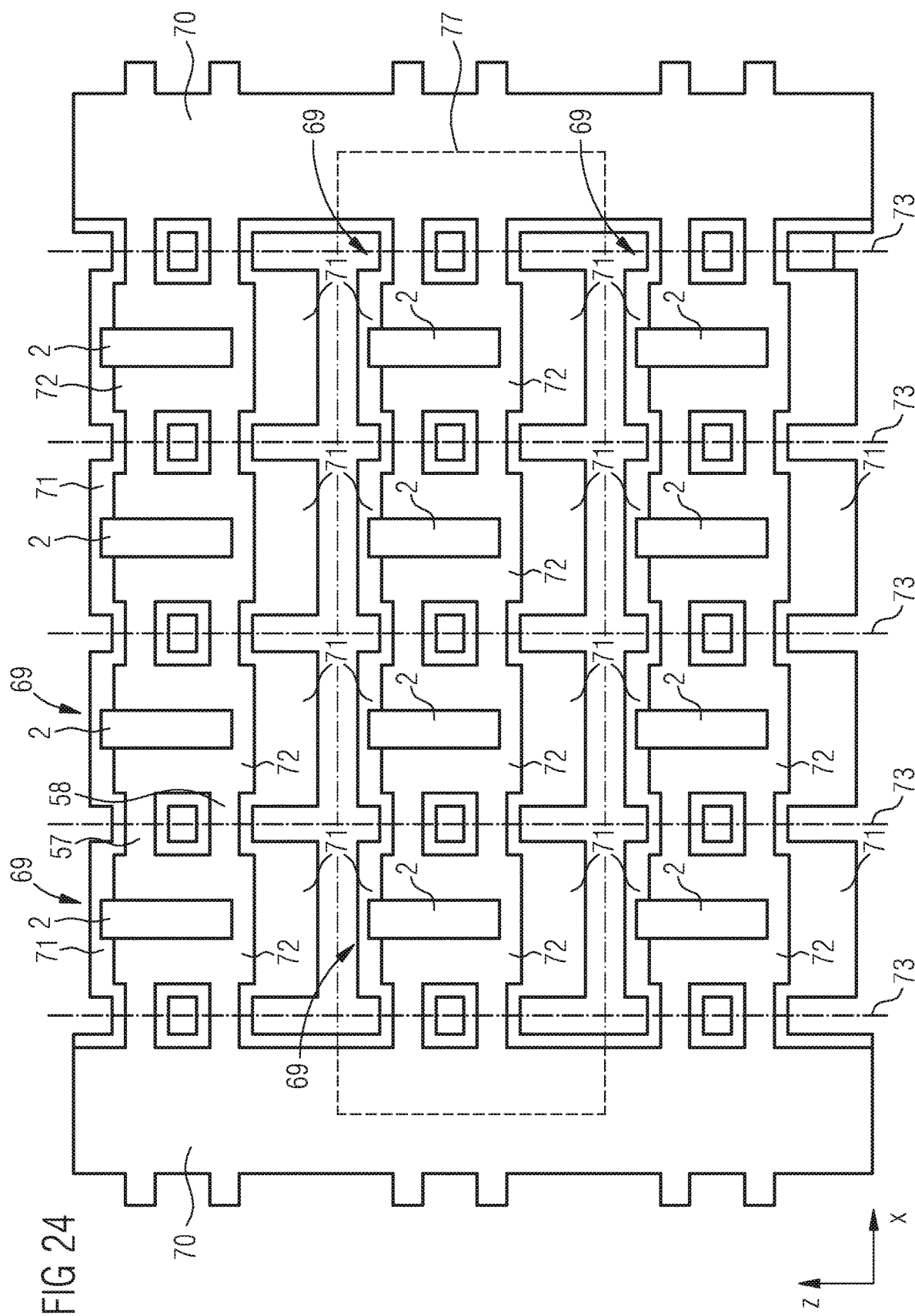
FIG. 24 depicts a schematic top view of a half-etched lead frame with fitted laser chips.

FIG. 24 shows in a schematic depiction a composite of lead-frame sections 69, which are connected to each other and to lateral anchor strips 70 via webs 57, 58. The composite shows four lead-frame sections 69 each arranged in a row, which may later be used as first and second components 3, 4 for manufacturing the laser component. The lateral anchor strips 70 hold the rows of lead-frame sections 69 together in a panel. The composite of FIG. 24 represents a half-etched lead frame. Laser chips 2 are already mounted on the lead-frame sections 69. In addition, the lead-frame sections 69 have already been subjected to an etching process so that the lead-frame sections 69 have etched surfaces 71 all around. The etched surfaces 71 have been formed in the way as already explained in the previous examples. In addition, the lead-frame sections 69 have non-etched surface areas 72. The non-etched surface areas 72 are darkened and mainly represent the flat areas of the first side faces of the first and second component. Dotted saw marks 73 are shown in the composite. The saw marks 73 run in parallel to the anchor strips 70.

The composite of FIG. 24 may be divided up into strips 77 by cutting the composite along the outer saw marks 73, which are located directly next to the anchor strips 70. A strip 77 then comprises four lead-frame sections 69 arranged side by side.

Figure 25:
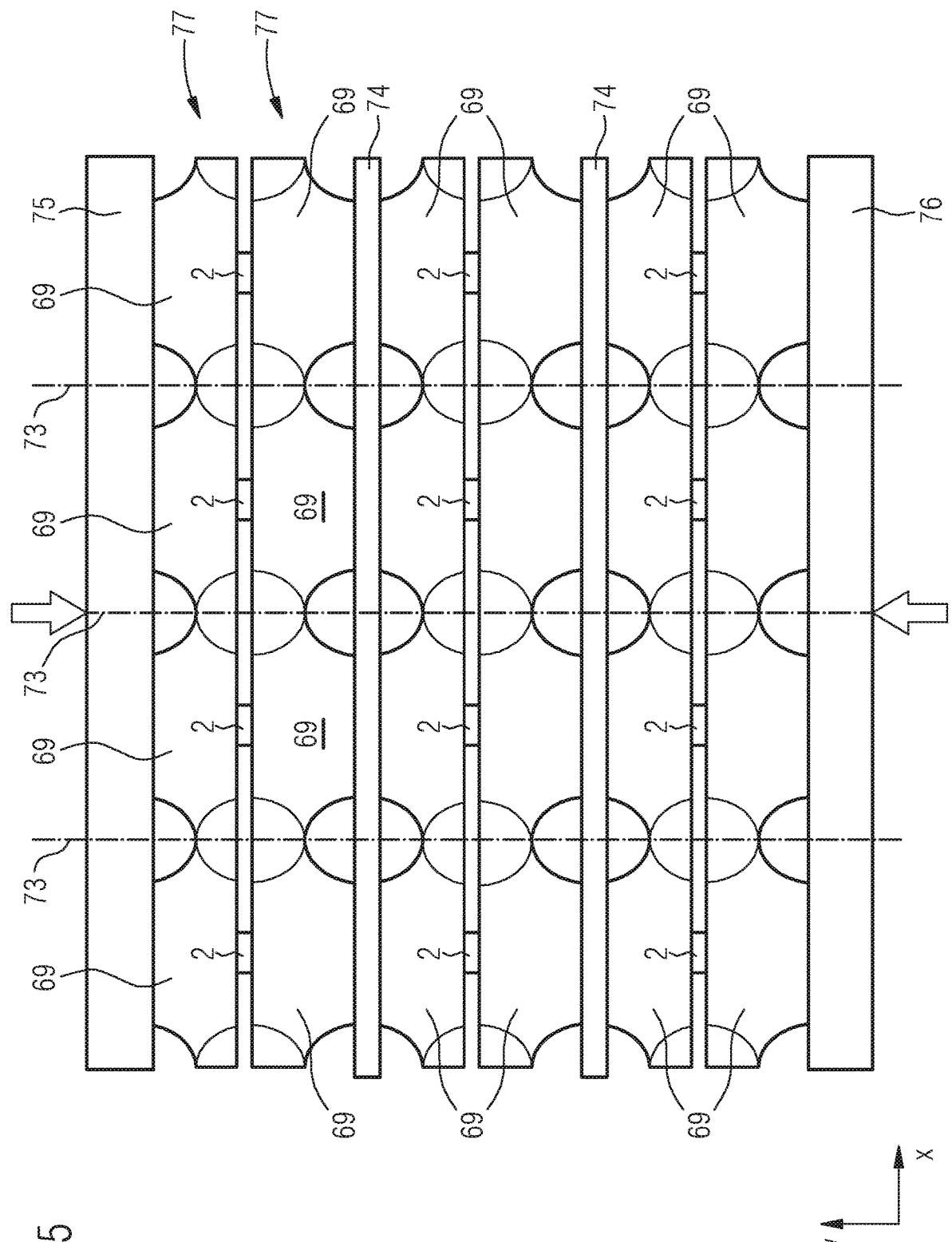
FIG. 25 shows an arrangement with several half-etched lead frames arranged on top of one another comprising fitted laser chips.

FIG. 25 shows an arrangement of a plurality of strips 77 arranged on top of one another, with a laser chip 2 arranged between two strips 77 on each lead-frame section 69. In addition, an elastic intermediate layer 74 may be arranged between two strips 77. The strips 77 are pressed together from above and from below with a clamping carrier 75, 76 each. In this arrangement, the conversion elements 16 and/or the insulation material 41 and/or the cover layer 59 may be mounted cost-effectively in the panel. The intermediate layers 74 are made of an elastic material and serve to compensate for une-venness of the strips 77. Depending on the selected embodiment, the intermediate layers 74 may be dispensed with.

After connecting the laser chips 2 with the lead-frame sections 69 positioned on top of them via corresponding connecting layers and after mounting the conversion elements 16 and especially after inserting the insulating material 41 or, respectively, the cover layer 59, the strips 77 may be separated into individual laser components by singulating the strips along the depicted saw marks 73. In this way, the laser components described above are obtained.

The lead-frame sections 69 of FIG. 24 may have all shapes of the first or second components 3, 4 described above, depending on the selected embodiment.

FIGS. 26 to 28 show method steps of a further manufacturing method for the laser component 1.

FIG. 26 shows a carrier 78 onto which the first components 3 were fabricated using additive processes such as a three-di-mensional printing process, a galvanic deposition process, a copper electroplating process with photoresist, or a laser sintering process. The first components 3 may e.g. be made of a metal, particularly copper. By means of the described layer deposition processes, the shape of the first component 3 may be produced according to one of the previously described embodiments. The component 3 may e.g. also be produced from a metal block using an etching process.

FIG. 27 then shows a further method step in which the laser chips 2 and the conversion elements 16 are mounted on the components 3. For mounting the conversion elements 16 and the laser chips 2, soldering, gluing and/or sintering processes with the corresponding soldering, gluing or sintering layers may be used.

FIG. 28 shows a further method step in which the insulation material 41 is applied to the arrangement of FIG. 27 in the desired form. In addition, the second component 4 is then applied to the conversion element 16, the insulating material 41 and the laser chip 2 using the additive processes. The second components 4 are produced in layers 79 one after the other, for example by a 3D-printing process or electroplating in photoresist. Depending on the selected embodiment example, the insulating material 41 embodied as a dielectric may also be photostructured and produced in several layers. The individual layers 79 of the insulating material 41 and the second component 4 are shown schematically as dashed lines. Subsequently, the carrier 78 may be removed and four laser components 1 are obtained according to the above-described embodiments.

The method described in FIGS. 26 to 28 may be used for all described embodiments of the laser component 1.

In all embodiments, connecting layers may be provided between the laser chip and the components, between the laser chip and the further component and/or between the further component and a component. In addition, depending on the selected embodiment, at least some or all of the connecting layers between the laser chip and the components, between the laser chip and the further component and/or between the further component and a component may be dispensed with. In these embodiments, the mechanical connection between the laser chip and the components, between the laser chip and the further component and/or between the further component and a component is at least partially or completely established either by a further housing or by the insulating material and/or by the cover layer.

In all embodiments of the laser component 1, the active zone 12 of laser chip 2 may be arranged, with regard to the Y-axis, in the center of the emission space 15 and in the center of laser component 1.

The invention was illustrated and described in more detail using the preferred embodiment examples. Nevertheless, the invention is not limited to the disclosed examples. Rather, other variations may be derived from it by an expert without exceeding the protective scope of the invention.

The invention claimed is:

1. A laser component comprising:
a laser chip;
the laser chip being arranged between a first component and a second component;
the first component and the second component each being thermally and electrically conductive;
the laser chip having a first side face, the laser chip having a second side face opposite to the first side face;
wherein the first side face of the laser chip is connected in an extensive manner to a first side face of the first component;
wherein the second side face of the laser chip is connected in an extensive manner to a first side face of the second component;
wherein the laser chip has an emission side;
the laser chip being embodied to emit electromagnetic radiation via the emission side;
the emission side being arranged between the first component and the second component;
the emission side being arranged inwardly set-back at a predetermined distance with regard to first front faces of the first component and the second component;
wherein an emission space is formed between the first side face of the first component and the first side face of the second component and adjacent to the emission side of the laser chip;
the emission space extending from the emission side of the laser chip to the first front faces of the first component and the second component;
wherein the first component and the second component are fixed on a carrier by side faces or by second front faces, and
wherein the carrier comprises an electrical conduction layer, wherein an electrical insulation layer is applied to a part of the electrical conduction layer, wherein a further electrical conduction layer is applied to the electrical insulation layer, and wherein the first component is fixed on the electrical conduction layer and electrically connected to the electrical conduction layer, and wherein the second component is fixed on the further electrical conduction layer and electrically connected to the further electrical conductive layer.

2. The laser component according to claim 1, wherein a conversion element is arranged in front of the emission side of the laser chip, wherein the conversion element is thermally coupled to the first component and the second component in an extensive manner, and wherein the conversion element is at least partially or completely, arranged in the emission space.

3. The laser component according to claim 1, wherein a conversion element is arranged in front of the emission side of the laser chip, wherein the conversion element is at least partially arranged outside of the emission space or completely outside of the emission space, wherein the conversion element is thermally coupled to the first front faces of the first component and the second component.

4. The laser component according to claim 1, wherein the laser chip projects into the emission space with a side face which is closer to an active zone of the laser chip than another side face.

5. The laser component according to claim 1, an intermediate space being formed between the first side face of the first component and the first side face of the second component laterally adjacent to the laser chip, the intermediate space being at least partially filled with an electrically insulating material, the electrically insulating material adjoining the first side of the first component and the first side face of the second component.

6. The laser component according to claim 1, wherein the emission space is at least partially filled with an insulating material transparent to the electromagnetic radiation of the laser chip.

7. The laser component according to claim 1, wherein a further thermally and electrically conductive component is provided between the laser chip and one of the first component or the second component, the further thermally and electrically conductive component having a coefficient of thermal expansion which has a smaller difference to the coefficient of thermal expansion of the laser chip than the coefficient of thermal expansion of the first component or the second component connected to the further thermally and electrically conductive component.

8. The laser component according to claim 1, wherein at least one of the first component or the second component is formed of a lead-frame section.

9. The laser component according to claim 1, wherein the recesses have been formed in the first side face of the first component and first side face of the second component by an etching process.

10. The laser component according to claim 1, wherein the first component and the second component have second front faces, wherein the first side face of the first component and the first side face of the second component have a greater distance adjacent to the second front faces than adjacent to the laser chip.

11. The laser component according to claim 10, wherein an intermediate space widens in a direction of the second front faces of the first component and the second component.

12. The laser component according to claim 1, wherein the first component and the second component have edges, ridges, or both the edges and the ridges at further side faces, on the first front faces, second front faces, or the further side faces, the first front faces, and the second front faces, wherein covering material covers the edges, ridges, or both the edges and the ridges of surfaces of the first component and the second component at least partially or completely.

13. A method for producing a laser component according to claim 1, wherein a laser chip is arranged between the first component and the second component;
wherein the first component and the second component comprise a thermally and electrically conductive material; wherein the laser chip has a first side face;
wherein the laser chip has a second side face opposite to the first side face;
wherein the first side face of the laser chip is connected in an extensive manner to a first side face of the first component;
wherein the second side face of the laser chip is connected in an extensive manner to a first side face of the second component;
the laser chip having an emission side;
the laser chip being embodied to emit electromagnetic radiation via the emission side;
the laser chip being arranged between the first component and the second component in such a way that the emission side of the laser chip is arranged between the first component and the second component and is set back inwardly at a predetermined distance with regard to first front faces of the first component and the second component;
wherein an emission space is formed between the first side face of the first component and the first side face of the second component and adjacent to the emission side of the laser chip;
the emission space extending from the emission side of the laser chip to the first front faces of the first component and the second component;
wherein the first component and the second component are fixed on a carrier by side faces, in particular by second front faces, and
wherein the carrier comprises an electrical conduction layer, wherein an electrical insulation layer is applied to a part of the electrical conduction layer, wherein a further electrical conduction layer is applied to the electrical insulation layer, and wherein the first component is fixed on the electrical conduction layer and electrically connected to the electrical conduction layer, and wherein the second component is fixed on the further electrical conduction layer and electrically connected to the further electrical conductive layer.

14. The method according to claim 13, wherein a conversion element is arranged in front of the emission side of the laser chip, wherein the conversion element is thermally coupled to the first component and the second component in an extensive manner, wherein the conversion element is either arranged at least partially or completely, in the emission space, or wherein the conversion element is arranged completely outside of the emission space.

15. The method according to claim 13, wherein a first composite with a plurality of first lead-frame sections is provided, wherein a laser chip is positioned on each of the first lead-frame sections, wherein a second composite is provided with second lead-frame sections, wherein the second composite is positioned on the first composite in such a way that a second lead-frame section is positioned on a laser chip in each case, wherein first and second lead-frame sections between which a laser chip is arranged are connected to one another in each case.

16. The method according to claim 13, wherein the first component, the second component, or both the first component and the second component are manufactured a layer deposition processes, a 3D printing process, a laser sintering process, or a galvanic deposition process.

17. The method according to claim 13, wherein, before mounting the first component and the second component, recesses are introduced into the first side face of the first component and the first side face of the second component by an etching process,
wherein the first component and the second component are mounted in such a way that the recesses of the first side face of the first component and the first side face of the second component form at least part of the emission space.

18. The laser component according to claim 1, wherein the first side face of the first component and the first side face of the second component have recesses at least in a region of the emission space; and
   wherein the recesses of the first side face of the first component and the first side face of the second component form a part of the emission space.

19. A laser component comprising:
   a laser chip, wherein the laser chip being arranged between a first component and a second component,
   wherein the first component and the second component being thermally and electrically conductive,
   wherein the laser chip having a first side face and a second side face opposite to the first side face,
   wherein the first side face of the laser chip is connected in an extensive manner to a first side face of the first component,
   wherein the second side face of the laser chip is connected in an extensive manner to a first side face of the second component,
   wherein the laser chip has an emission side,
   wherein the laser chip being embodied to emit electromagnetic radiation via the emission side,
   wherein the emission side being arranged between the first component and the second component,
   wherein the emission side being arranged inwardly setback at a predetermined distance with regard to first front faces of the first component and the second component,
   wherein an emission space is formed between the first side face of the first component and the first side face of the second component and adjacent to the emission side of the laser chip,
   wherein the emission space extending from the emission side of the laser chip to the first front faces of the first component and the second component, and
   wherein a further thermally and electrically conductive component is provided between the laser chip and one of the first component or the second component, the further thermally and electrically conductive component having a coefficient of thermal expansion which has a smaller difference to the coefficient of thermal expansion of the laser chip than the coefficient of thermal expansion of the first component or the second component connected to the further thermally and electrically conductive component.

* * * * *